United States Patent [19]
Hiruta

[11] Patent Number: 5,998,861
[45] Date of Patent: Dec. 7, 1999

[54] SEMICONDUCTOR DEVICE HAVING BALL GRID ARRAY

[75] Inventor: Yoichi Hiruta, Kashiwa, Japan

[73] Assignee: Kabushiki Kaisha Toshiba, Kawasaki, Japan

[21] Appl. No.: 08/721,012

[22] Filed: Sep. 26, 1996

[30] Foreign Application Priority Data

Sep. 28, 1995 [JP] Japan ................................. 7-250928

[51] Int. Cl.⁶ .................................................. H01L 23/48
[52] U.S. Cl. ........................ 257/700; 257/738; 257/787
[58] Field of Search ............................ 257/48, 778, 723, 257/700, 737, 738, 787

[56] References Cited

U.S. PATENT DOCUMENTS

| | | | |
|---|---|---|---|
| 4,825,284 | 4/1989 | Soga et al. | |
| 4,999,699 | 3/1991 | Christie et al. | |
| 5,334,857 | 8/1994 | Mennitt et al. | 257/48 |
| 5,629,566 | 5/1997 | Doi et al. | 257/738 |
| 5,640,051 | 6/1997 | Tomura et al. | 257/778 |
| 5,641,990 | 6/1997 | Chiu | 257/737 |
| 5,654,590 | 8/1997 | Kuramochi | 257/700 |
| 5,677,575 | 10/1997 | Maeta et al. | 257/778 |
| 5,710,695 | 1/1998 | Manteghi | 257/707 |

FOREIGN PATENT DOCUMENTS

4-260358  9/1962  Japan .

OTHER PUBLICATIONS

Microelectronics Packaging Handbook, Van Nostrand Reinhold, New York, 1989, p. 368.

Primary Examiner—Peter Toby Brown
Assistant Examiner—Roy Potter
Attorney, Agent, or Firm—Finnegan, Henderson, Farabow, Garrett & Dunner, L.L.P.

[57] ABSTRACT

An LSI chip has first electrodes. A chip carrier has a board, second electrodes arranged on a first surface of the board, third electrodes arranged on a second surface of the board, and wires connecting second electrodes to third electrode each other. Bumps combine the first electrodes of the LSI chip with the second electrodes of the chip carrier each other. Resin fills a space between a main surface of the LSI chip and a first surface of the board, so as to fix the bumps to each other. Ball electrodes are combined with third electrodes of the chip carrier.

49 Claims, 22 Drawing Sheets

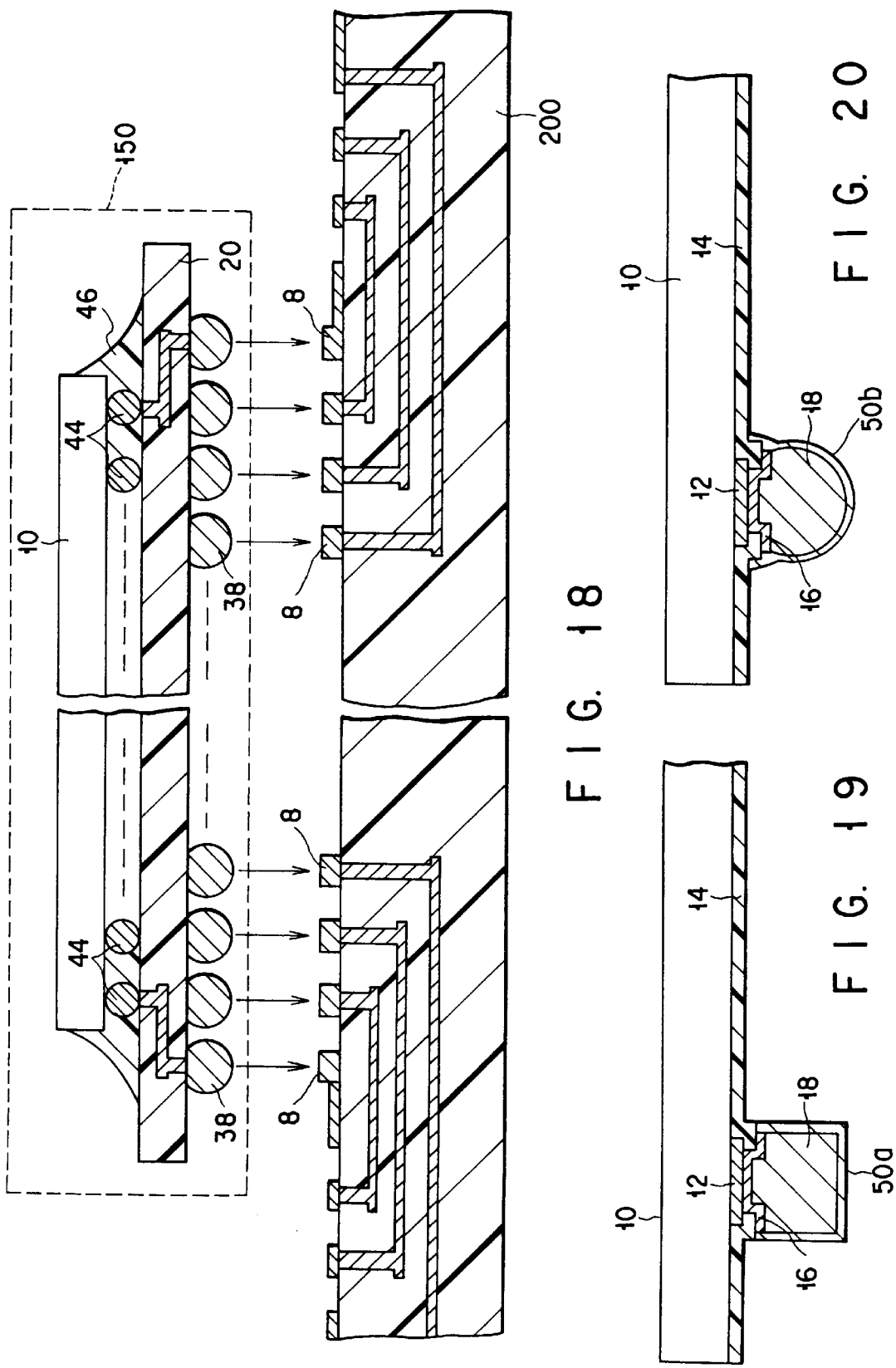

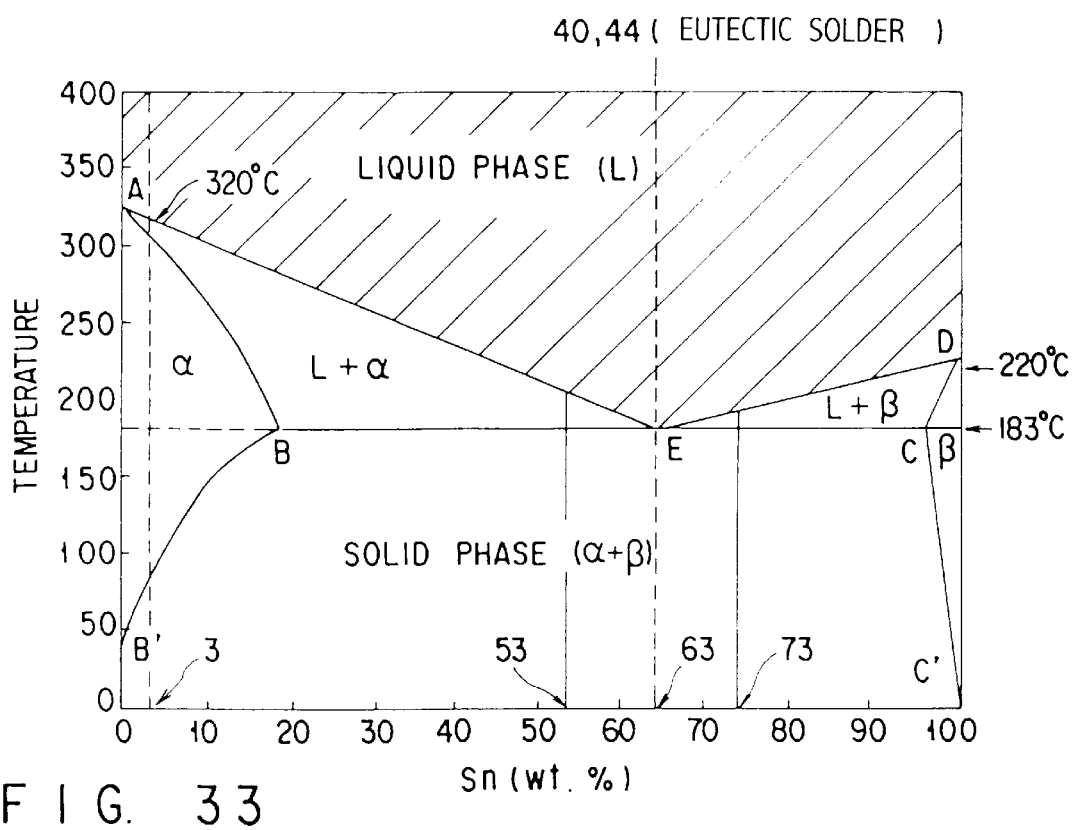
F I G. 33
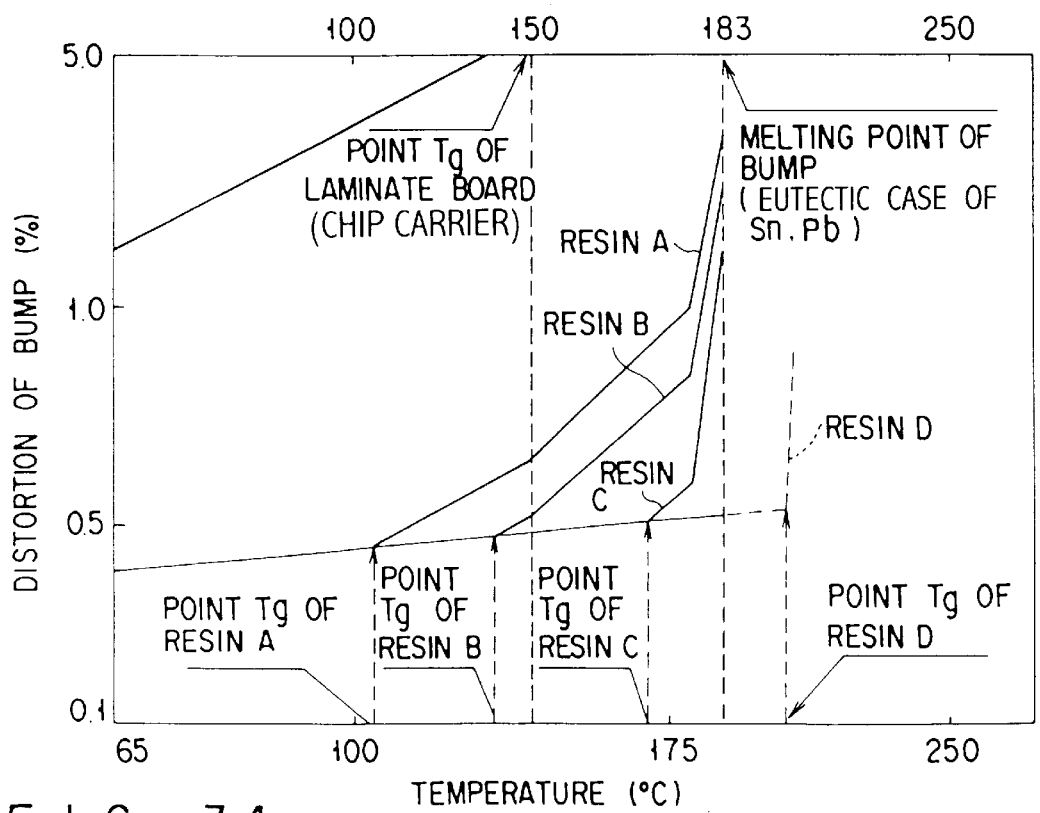
F I G. 34

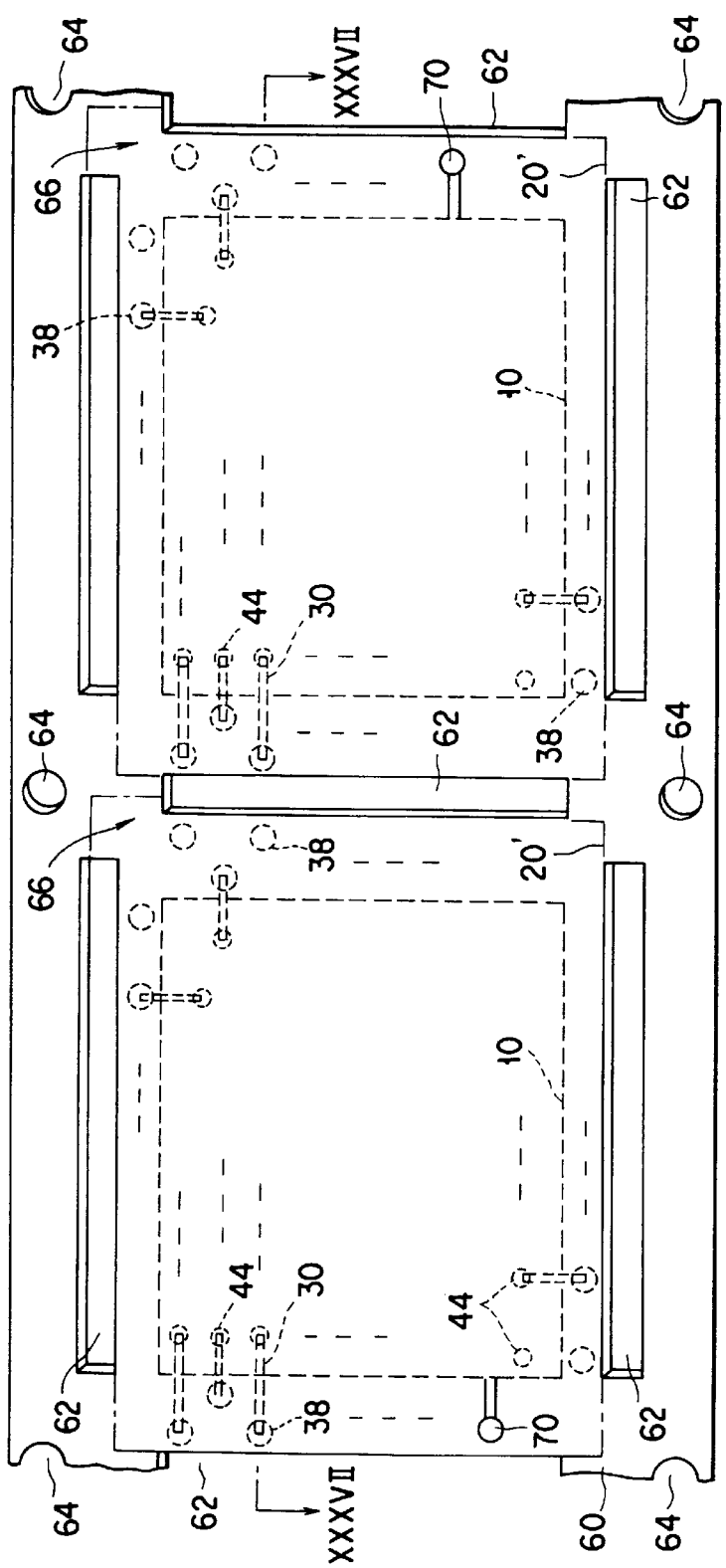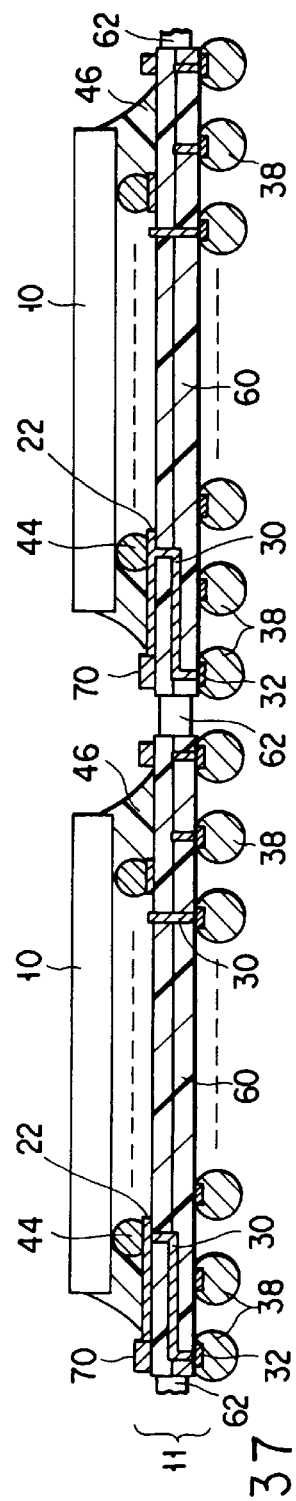
FIG. 36
FIG. 37

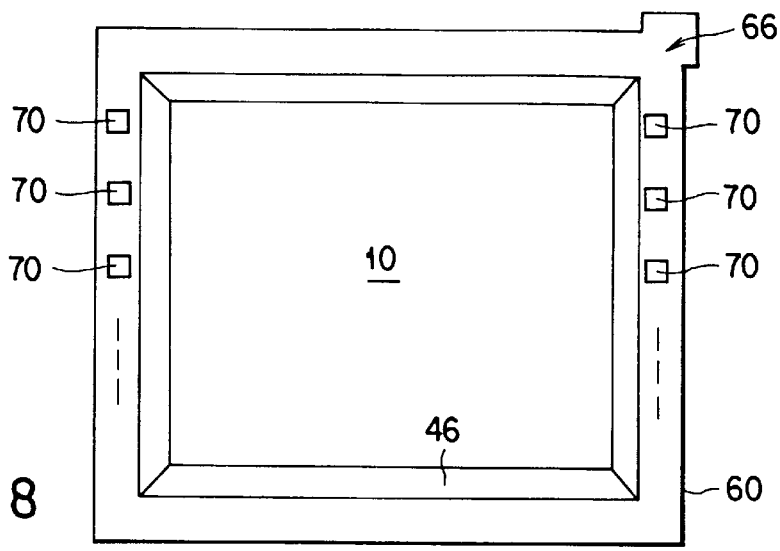
F I G. 38
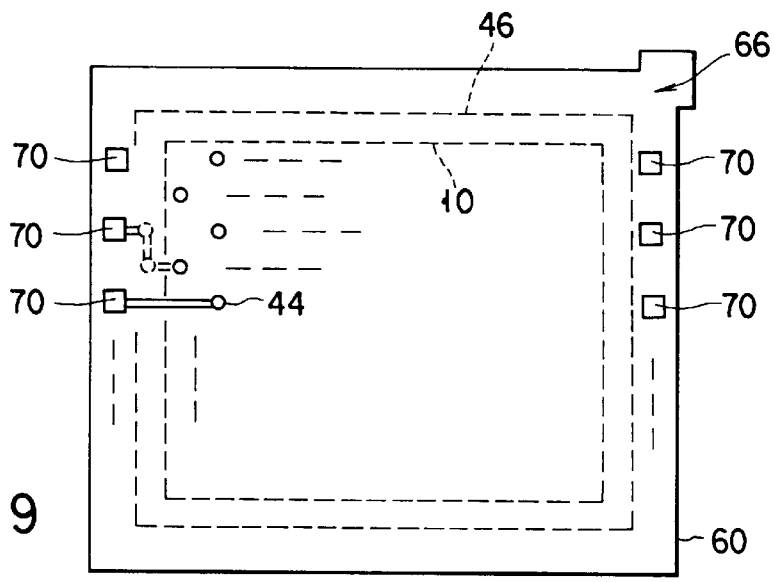
F I G. 39
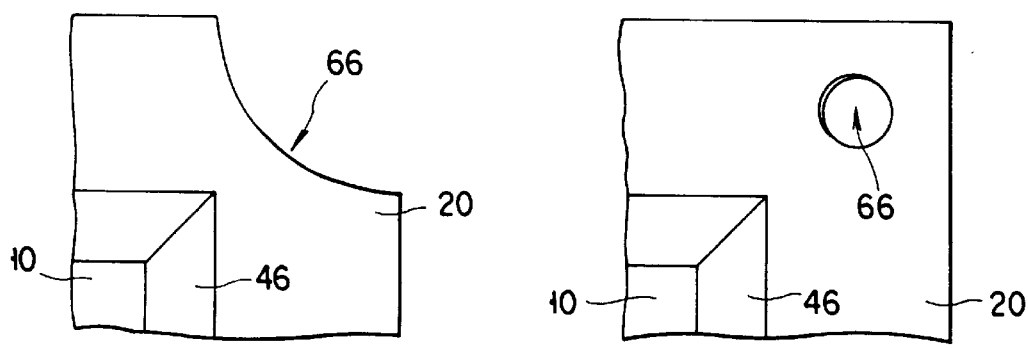
F I G. 40   F I G. 41

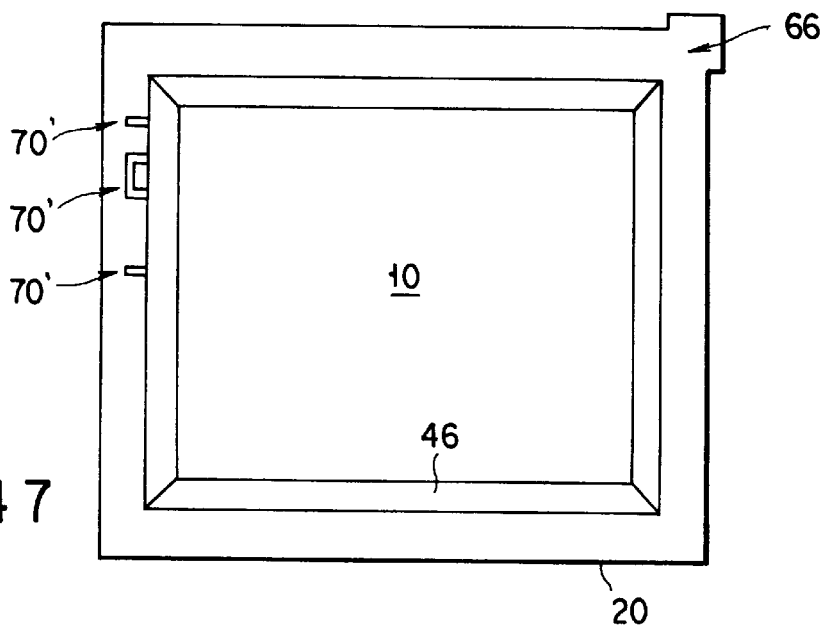
F I G. 47
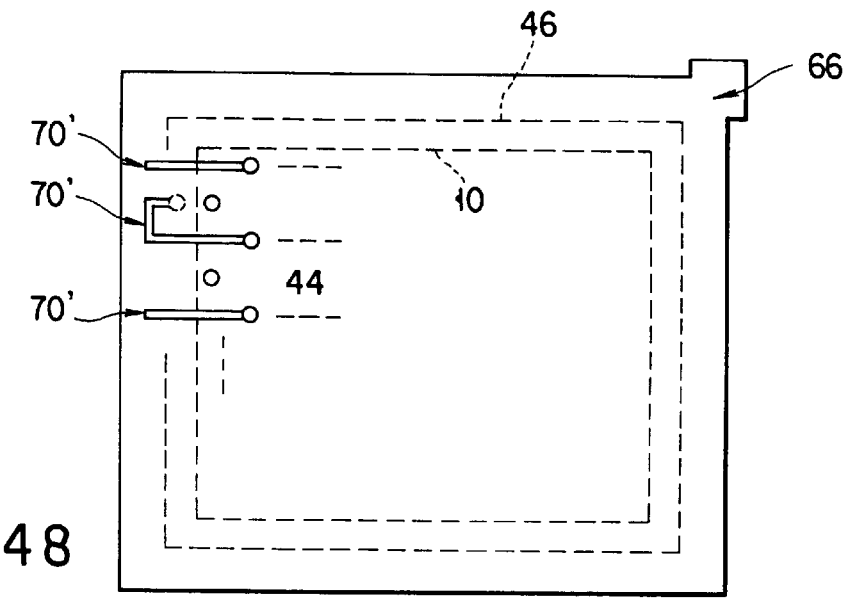
F I G. 48
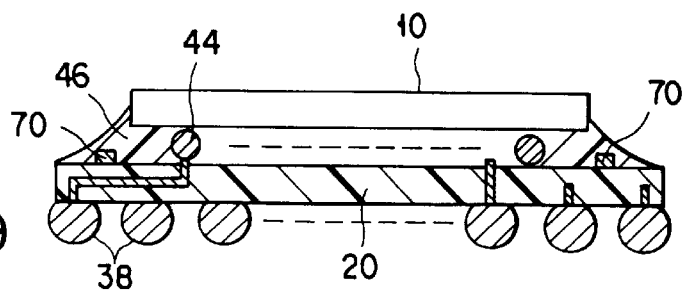
F I G. 49

SEMICONDUCTOR DEVICE HAVING BALL GRID ARRAY

BACKGROUND OF THE INVENTION

1. Field of the Invention

The present invention relates to improvement of a semiconductor device having a ball grid array.

2. Description of the Related Art

FIG. 1 shows a conventional semiconductor device having a ball grid array.

Ball bumps 2 are formed on a main surface of an LSI (large scale integrated circuit) chip 1. The bumps 2 are formed of metal such as solder.

A chip carrier 3 comprises a laminate board 4 having a plurality of layers, wires 5 passing through each layer and each interlayer, electrodes 6a formed on one surface side of the laminate board 4, and electrodes 6b formed on the other surface side of the laminate board 4.

The wires 5 electrically connect the electrodes 6a to the electrodes 6b. The electrodes 6b are arrayed on the other surface side of the laminate board 4. Ball electrodes 7 are formed on the electrodes 6b, respectively. The ball electrodes 7 constitute a ball grid array. The ball electrodes 7 are formed of metal such as solder, etc.

The LSI chip 1 is combined with the electrodes 6a of one side of the laminate board 4 by the ball bumps 2. As a result, the LSI chip 1 is brought into contact with the ball electrodes 7.

The following will explain the features of the above-explained semiconductor device having the ball grid array.

The first feature lies in that the mount of the semiconductor device can be easily performed.

Specifically, as shown in FIG. 2, a semiconductor device 100 is placed on a print circuit board 200, and heat is applied thereon, so that the mount of the semiconductor device can be completed.

As shown in FIG. 3, the print circuit board 200 on which the semiconductor device 100 is mounted is moved via a reflow furnace 300. The ball electrodes 7 of the semiconductor device 100 are temporarily melted when entering the reflow furnace 300. Then, when the electrodes 7 come out of the reflow furnace 300, the ball electrodes 7 are solidified again. At the time when the ball electrodes 7 are solidified again, they are combined with electrodes 8 of the print circuit board 200.

The second feature lies in that the semiconductor device can be miniaturized.

As shown in FIG. 4, the LSI chip 1 is combined with the electrodes 6a of the chip carrier 3 by the ball bumps 2. As a result, the semiconductor device of FIG. 1 can be miniaturized by a width H as compared with a semiconductor device having a bonding wire 9 (Japanese Patent Application H3-22337).

Next, the following will explain the disadvantages of the above-explained semiconductor device having the ball grid array.

As shown in FIG. 3, in the reflow furnace 300, heat is applied to the ball bumps 2 as well as the ball electrodes 7. In this case, if the ball electrodes 7 and the ball bumps 2 are formed of the same material, the melting point for electrodes 7 becomes the same as the melting point for the ball bumps 2. As a result, when the ball electrodes 7 are melted, the ball bumps 2 are also melted, so that the shape of each bump is largely distorted.

To prevent the bumps 2 from being distorted, it is needed that materials for both bumps 2 and the ball electrodes 7 be differed from each other. Thereby, the melting point of the material for the bumps 2 must be set to be higher than that of the material for the ball electrodes 7.

Conventionally, the ball electrodes 7 are formed of eutectic solder containing, for example, Sn (tin) of 63 wt %, and Pb (lead) of 37 wt %. The ball bumps 2 are formed of high melting point solder containing Sn of 3 wt % and Pb of 97 wt %.

FIG. 5 is a phase diagram showing a phase of an alloy containing Sn and Pb in a case where temperature and composition are set as parameters (constant pressure).

In FIG. 5, a point E is an eutectic point, a point A is a melting point of Pb, and a point D is a melting point of Sn. A line connecting points A, E, and D is a boundary line between a solid phase and a liquid phase.

As shown in FIG. 5, in the case of the alloy (solder) formed of Sn and PB, if a Sn content and a Pb content are 63 wt % and 37 wt %, respectively, the allow becomes eutectic, and its melting point is about 183° C.

If the Sn content and the Pb content are 3 wt % and 97 wt %, respectively, the melting point is about 320° C.

In other words, the bumps (high melting point solder) 2 are formed of the alloy having of Sn of 3 wt % and Pb of 97 wt %, and the ball electrodes 7 are formed of the alloy having of Sn of 63 wt % and Pb of 37 wt %. As a result, the melting point of each bump 2 is higher than that of each ball electrode 7.

However, in a case where the melting point of each bump 2 is higher than that of each ball electrode 7, the following disadvantage will occur.

Generally, the melting point of each bump 2 results in an extremely high value exceeding 300° C. (for example, about 320° C.).

Due to this, the laminate board 4 of the chip carrier 3 must be formed of material, which can resist against the extremely high heat exceeding 300° C. not to cause deformation and distortion.

However, for the present, there is no other material than ceramics such as alumina ceramics, which can resist heat exceeding 300° C. and which can fully function as chip carrier 3. However, since such ceramics are expensive, the manufacturing cost of the semiconductor device will be increased.

SUMMARY OF THE INVENTION

An object of the present invention is to miniaturize a semiconductor device having a ball grid array, so as to reduce the manufacturing cost, and prevent the deformation of bumps for combining an LSI chip with a chip carrier in melting ball electrodes, so as to improve manufacture yield.

Also, another object of the present invention is to prevent the ball electrodes of the semiconductor device from being damaged before the semiconductor device is mounted on a print circuit board.

Further, another object of the present invention is to improve a throughput in a manufacturing process of a semiconductor device, that is, to increase the number of semiconductor devices, which can be manufacture in a fixed period of time.

Moreover, another object of the present invention is to provide a semiconductor device having a ball grid array, which can easily test an LSI chip.

To attain the above object, according to the first aspect of the present invention, there is provided a semiconductor device comprising an LSI chip having first electrodes on its main surface; a chip carrier for mounting the LSI chip thereon; bumps for combining the first electrodes of the LSI and the second electrodes of the chip carrier to each other; and resin filling a space between the main surface of the LSI chip and the first surface of the board, so as to fix the bumps to each other.

The chip carrier has a board, second electrodes arranged on a first surface of the board, third electrodes arranged on a second surface of the board, and wires for connecting the second and third electrodes to each other.

The main surface of the LSI chip and the first surface of the board are opposite to each other.

Also, according to the semiconductor device of this invention, ball electrodes to be combined with the third electrodes may be further provided. In this case, the bumps and the ball electrodes are preferably formed of the same material having the same material.

According to the second aspect of the present invention, there is provided a semiconductor device comprising an LSI chip having semiconductor elements; an insulating film covering a main surface of the LSI chip, and having holes; electrodes arranged to be exposed to a bottom portion of the holes of the insulating film; and bumps combined with the electrodes, and arrayed on the main surface of the LSI.

The bumps are formed of an alloy having a plurality of elements, and a composition of the alloy is set such that the alloy becomes eutectic.

According to the third aspect of the present invention, there is provided a chip carrier comprising a laminate board having a plurality of layers; first electrodes arranged on a first surface of the laminate board; second electrodes arranged on a second surface of the laminate board; wires arranged to pass through each layer of the laminate board and each interlayer, and connect the first electrodes and the second electrodes to each other; bumps combined with the first electrodes, and arrayed on the first surface of the laminate board; and ball electrodes combined with the second electrodes, and arranged on the second surface of the laminate board.

The bumps and the ball electrodes formed of the same material having the same composition.

According to the fourth aspect of the present invention, there is provided a method for manufacturing a semiconductor device comprising the steps of forming first bumps on first electrodes of a main surface of an LSI chip; forming second bumps on second electrodes of a first surface of a chip carrier; opposing the main surface of the LSI chip and the first surface of the chip carrier to each other, contacting the first bumps and the second bumps each other, temporarily heating the first and second bumps under the state to be combined with each other, so as to form third bumps; and filling a space between the main surface of the LSI chip and the first surface of the chip carrier with resin so as to fix the third bumps.

According to the fifth aspect of the present invention, there is provided a semiconductor device comprising an LSI chip having first electrodes on its main surface; a chip carrier for mounting the LSI chip thereon; bumps for combining first electrodes of the LSI chips with the second electrodes of the chip carrier to each other; and resin filling a space between the main surface of each of the LSI chips and the first surface of the board, so as to fix the bumps to each other.

The chip carrier has a board with slits surrounding carrier sections, second electrodes arranged on a first surface of the board, third electrodes arranged on a second surface of the board, and wires for connecting the second and third electrodes to each other.

According to the sixth aspect of the present invention, there is provided a tester for testing a semiconductor device having an LSI chip on a first surface of a chip carrier, arrayed ball electrodes on a second surface of the chip carrier, and test terminals on an edge portion of the first surface of the chip carrier.

The tester comprises a main body having a cavity where the semiconductor device is placed, and projections for supporting the semiconductor device of the cavity in a state that the ball electrodes are positioned at the upper side and the LSI chip are positioned at the lower side; and socket electrodes, provided to movable up and down, and contacting test terminals of the semiconductor device of the cavity when moving upward.

According to the seventh aspect of the present invention, there is provided a tester for testing a semiconductor device having an LSI chip on a first surface of a chip carrier, arrayed ball electrodes on a second surface of the chip carrier, and test terminals on an edge portion of the first surface of the chip carrier.

The tester comprises a main body having a cavity where the semiconductor device is placed in a state that the ball electrodes are positioned at the upper side and the LSI chip are positioned at the lower side; and socket electrodes, provided to movable up and down, and contacting test terminals of the semiconductor device of the cavity when moving upward.

According to the eighth aspect of the present invention, there is provided a chip carrier comprising a laminate board having a plurality of layers and slits surrounding carrier sections; first electrodes arranged on a first surface of the laminate board; second electrodes arranged on a second surface of the laminate board; wires arranged to pass through each layer of the laminate board and each interlayer, and connect the first electrodes and the second electrodes to each other; two reinforcing boards, formed to be frame-shaped, for reinforcing an edge of the laminate board by inserting the laminate board therebetween; and test terminals arranged on the reinforcing boards of a first surface side of the laminate board.

According to the ninth aspect of the present invention, there is provided a chip carrier comprising a laminate board having a plurality of layers and slits surrounding carrier sections; first electrodes arranged on a first surface of the laminate board; second electrodes arranged on a second surface of the laminate board; wires arranged to pass through each layer of the laminate board and each interlayer, and connect the first electrodes and the second electrodes to each other; two reinforcing boards, formed to be ladder-shaped, for reinforcing an edge of the laminate board by inserting the laminate board therebetween; and test terminals arranged on the reinforcing boards of a first surface side of the laminate board.

According to the tenth aspect of the present invention, there is provided a chip carrier comprising a laminate board having a plurality of layers and slits surrounding carrier sections; first electrodes arranged on a first surface of the laminate board; test terminals arranged on an edge of the first surface of the laminate board; second electrodes arranged on a second surface of the laminate board; wires arranged to pass through each layer of the laminate board and each interlayer, and connect the first electrodes and the second electrodes to each other; and two reinforcing boards, formed to be frame-shaped, for reinforcing an edge of the laminate board by inserting the laminate board therebetween wherein openings are formed on the reinforcing board at a first surface side of the laminate board, and the test terminals are exposed on the opening.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 18 is a view showing a state when the semiconductor device of FIG. 6 is mounted on the print circuit board;

FIGS. 19 to 23 are views each showing a step of a second manufacturing method of the semiconductor device of FIG. 6;

FIG. 33 is a phase diagram showing a phase of an alloy containing Sn and Pb if temperature and composition are set as parameters (constant pressure);

FIG. 34 is a view showing the relationship between temperature and distortion of the bump in a case where resin material is used as a parameter;

FIG. 36 is a view showing a semiconductor device having a ball grid array as a second invention of this invention;

FIG. 37 is a cross sectional view taken along a line of XXXVII—XXXVII of FIG. 36;

FIGS. 38 and 39 are views each showing a state after the laminate board of the semiconductor device of FIG. 36 is cut;

FIGS. 40 and 41 are views each showing an index indicating a direction of the semiconductor device;

FIGS. 47 and 48 are views each showing a modification of a test terminal;

FIG. 49 is a view showing a modification of the semiconductor device of FIG. 36;

DETAILED DESCRIPTION OF THE PREFERRED EMBODIMENTS

Embodiments of the present invention will be described with reference to the drawings.

Figure 1:
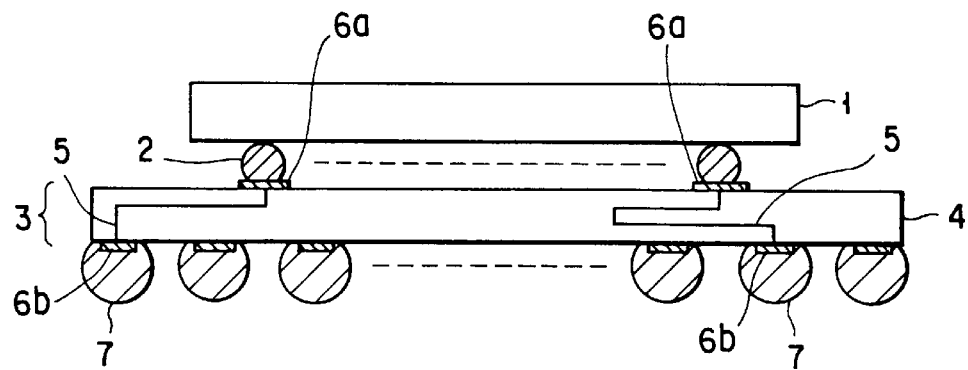
FIG. 1 is a view showing a conventional semiconductor device having a ball grid array.
Figure 2:
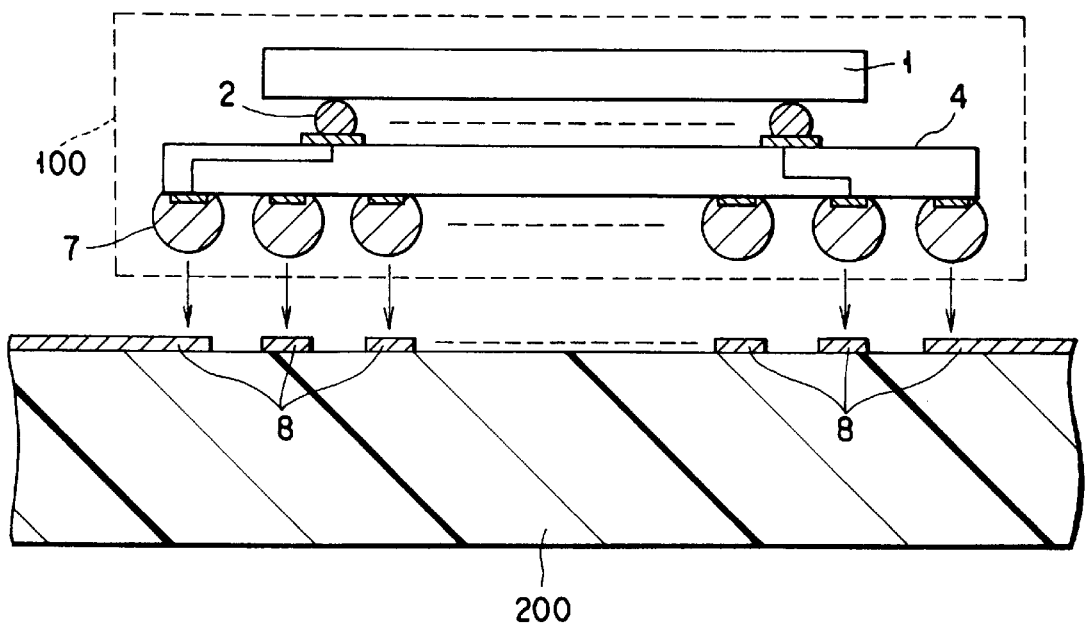
FIG. 2 is a view showing a state when the semiconductor device of FIG. 1 is mounted on a print circuit board.
Figure 3:
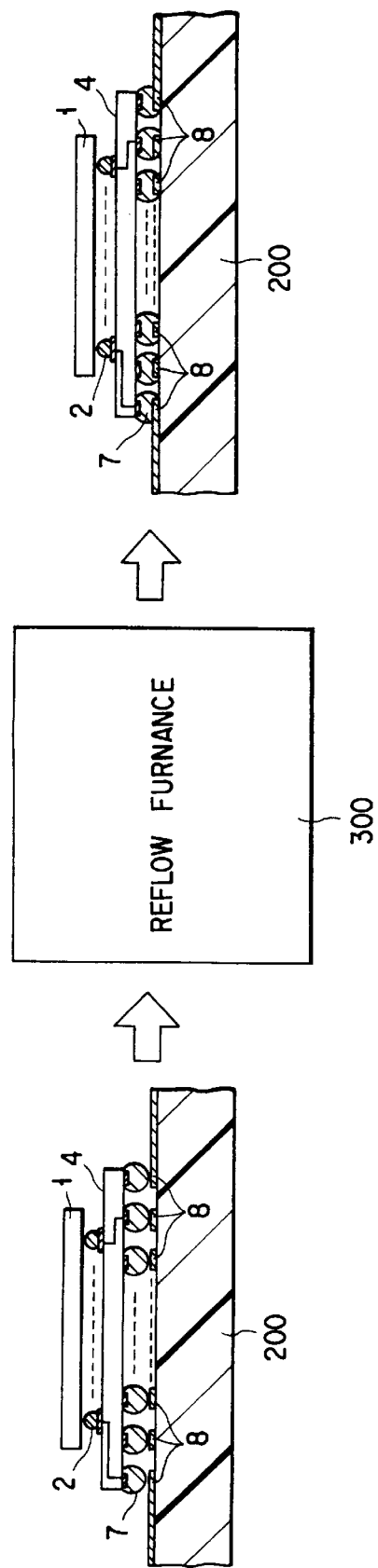
FIG. 3 is a view showing a reflow furnace, which is used when the semiconductor device is mounted on the print circuit board.
Figure 4:
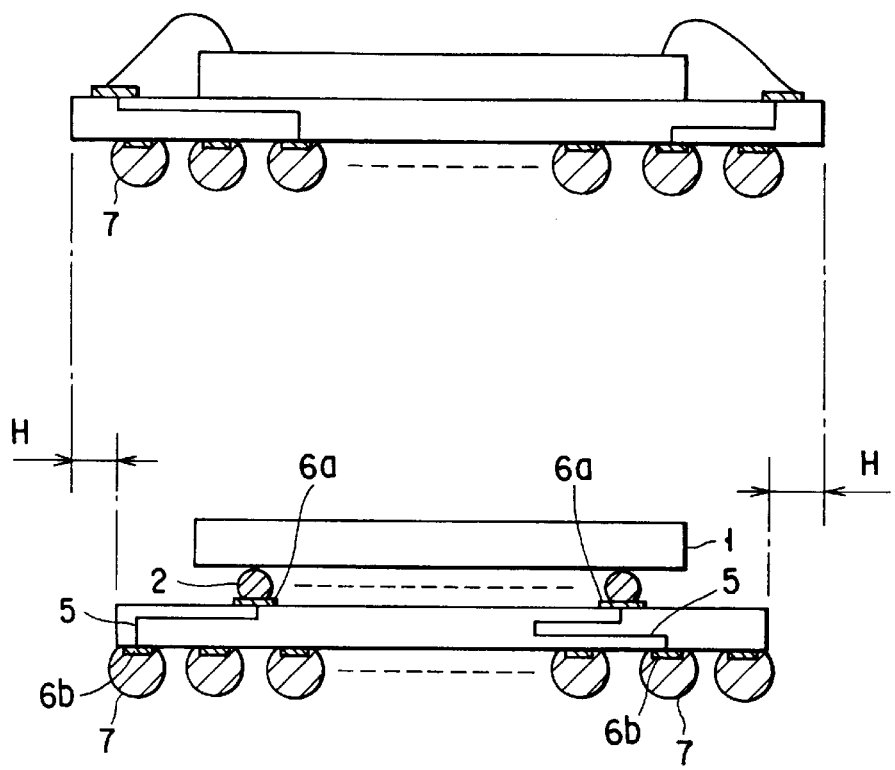
FIG. 4 is a view showing a comparison between two kinds of semiconductor devices.
Figure 5:
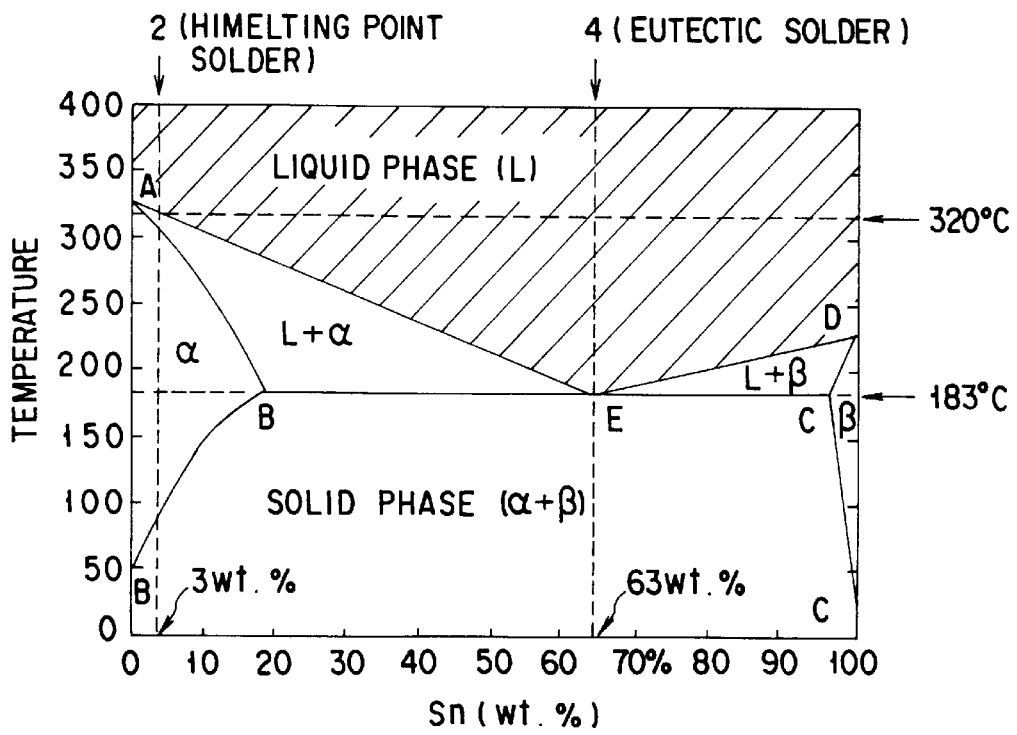
FIG. 5 is a phase diagram showing a phase of an alloy containing Sn and Pb if temperature and composition are set as parameters (constant pressure)
Figure 6:
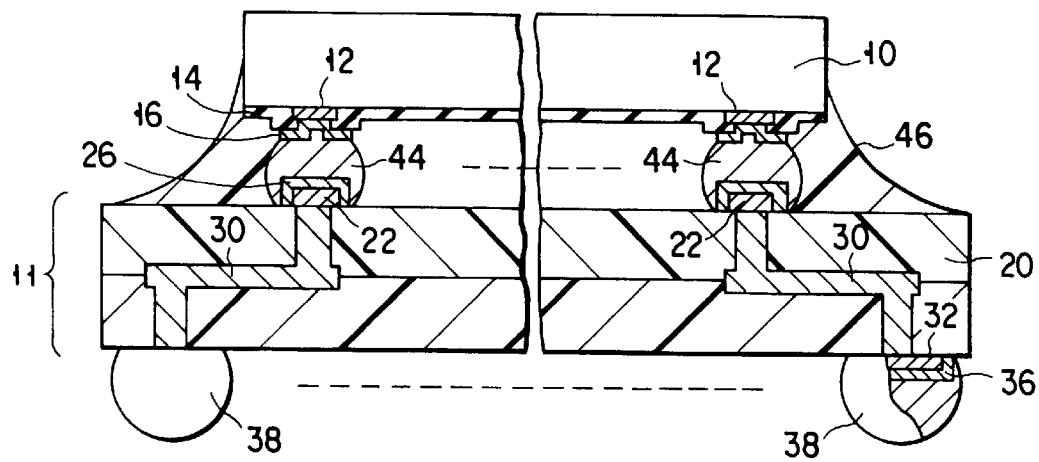
FIG. 6 is a view showing a semiconductor device having a ball grid array as a first invention of this invention.

FIG. 6 shows a semiconductor device having a ball grid array as a first invention of this application.

The main surface of an LSI (large scale integrated circuit) chip 10 is coated with a silicon oxide film ($SiO_2$) 14. A plurality of holes is formed in the silicon oxide film 14. Uncovered pads 12 are formed at the bottom of each of the holes. Barrier metals 16 are formed on each of the pads 12. The barrier metals 16 can be formed of, for example, nickel (Ni).

A carrier chip 11 comprises a laminate board 20 having a plurality of layers, wires 30 passing through each layer and each interlayer, electrodes 22 formed on one surface side of the laminate board 20, and electrodes 32 formed on the other surface side of the laminate board 20. The wires 30 electrically connect the electrodes 22 to the electrodes 32. The electrodes 22 are arrayed on one surface side of the laminate board 20. The electrodes 32 are arrayed on the other surface side of the laminate board 20.

Barrier metals 26 are formed on each of the electrodes 22. The barrier metals 26 can be formed of, for example, nickel (Ni). Similarly, barrier metals 36 are formed on each of the electrodes 32. The barrier metals 36 can be formed of, for example, nickel (Ni).

Ball electrodes 38, which constitute a ball grid array, are formed on the barrier metals 36. The ball electrodes 38 are formed of metal such as solder, etc.

Ball bumps 44 are formed between the barrier metals 16 formed on the pads 12 of the LSI chip 10 and the barrier metals 26 formed on the electrodes 22 of the chip carrier 11. The ball bumps 44 are formed of metal such as solder, etc., and combine the pads 12 and the electrodes 22 with each other. As a result, the LSI chip 10 is brought in contact with the ball electrodes 38.

The ball electrodes 38 and the ball bumps 44 are formed of the same material having the same composition. For example, they are formed of an alloy containing Sn (tin), and Pb (lead). The composition of the alloy is set to have, for example, Sn of 63 wt % and Pb of 37 wt % such that the melting point reaches the lowest point.

As explained in the description of the related art, if the ball electrodes 38 and the ball bumps 44 are formed of the same material having the same composition, the following disadvantages occur.

Specifically, when the semiconductor device is mounted on the print circuit board, the bumps 44 are melted so as to be deformed and distorted.

To prevent the bumps 44 from being deformed and distorted, resin 46 is packed in a space between the LSI chip 10 and the chip carrier 11. The resin 46 fills a space between the plurality of the bumps 44 arranged in the array form, and the bumps 46 are fixed to each other. The resin 46 is formed of polyimide, and its glass transition point is higher than the melting point of at least each of the ball electrodes and the ball bumps 44.

Even if the bumps 44 are melted in mounting the semiconductor device on the print circuit board, the deformation and distortion of the bumps 44 can be restrained by resin 46.

The laminate board 20 of the chip carrier 11 can be formed of material such as glass epoxy resin, polyimide resin, phenolic resin, BT resin, bakelite, etc. The prices of these materials are reasonable and their melting points are low. It is not needed that the laminate board 20 be formed of expensive material such as alumina ceramics.

In other words, the ball electrodes 38 and the ball pumps 44 are formed of the same material and the same same composition. Also, the melting point of each of the ball electrodes 38 and the ball bumps 44 are set to be low (for example, below 300° C.).

Therefore, according to the present invention, the miniaturization of the semiconductor device, the reduction of the manufacturing cost, and improvement of the manufacturing yield can be achieved at the same time.

Figure 7:
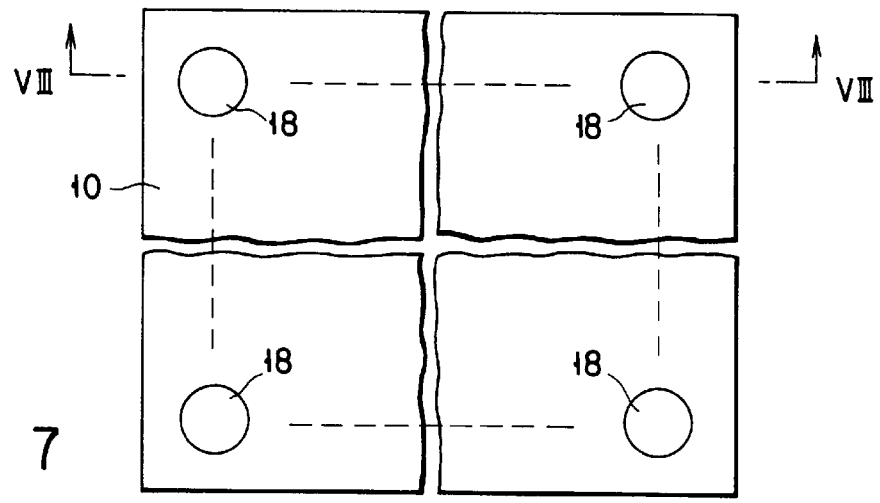
FIG. 7 is a view showing an LSI chip, which is used in the semiconductor device of FIG. 6.
Figure 8:
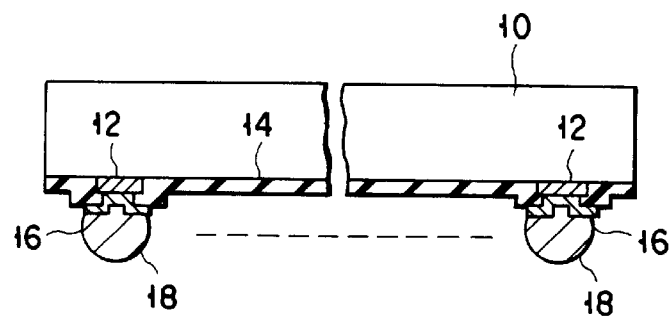
FIG. 8 is a cross sectional view taken along a line of VIII—VIII of FIG. 7.

FIG. 7 shows an LSI chip, which is used in manufacturing the semiconductor device of FIG. 6. FIG. 8 is a cross sectional view taken along a line of VIII—VIII of FIG. 7.

A plurality of semiconductor elements is formed on the main surface of the LSI chip 10. The LSI chip 10 is covered with the silicon oxide film 14. A plurality of holes is formed in the silicon oxide film 14. The uncovered pads 12 are formed at the bottom of each of the holes. The uncovered pads are arranged on line or in array. In the case of the pads arranged on line the pitch of each of the uncovered pads is about 200 μm. In the case of the pads arranged in array, the pitch of each of the uncovered pads is about 350 μm. The barrier metals 16 are formed on each of the pads 12. The barrier metals 16 can be formed of, for example, nickel (Ni).

A ball bump 18 is formed on each of the barrier metals 16. Each bump 18 is formed of an alloy containing Sn (tin), and Pb (lead). The composition of the alloy is set to have, for example, Sn of 63 wt % and Pb of 37 wt % such that the melting point reaches the lowest point.

Figure 9:
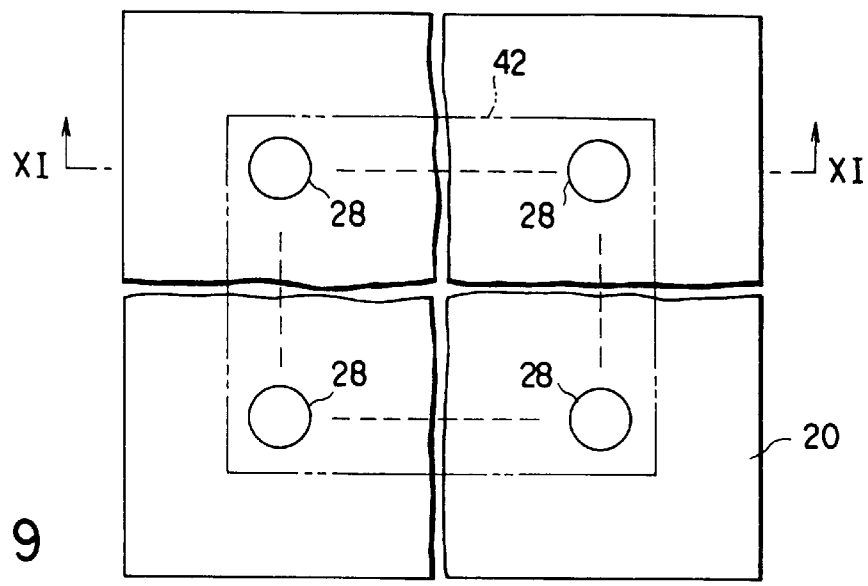
FIGS. 9 and 10 are views each showing a chip carrier, which is used in the semiconductor device of FIG. 6.
Figure 10:
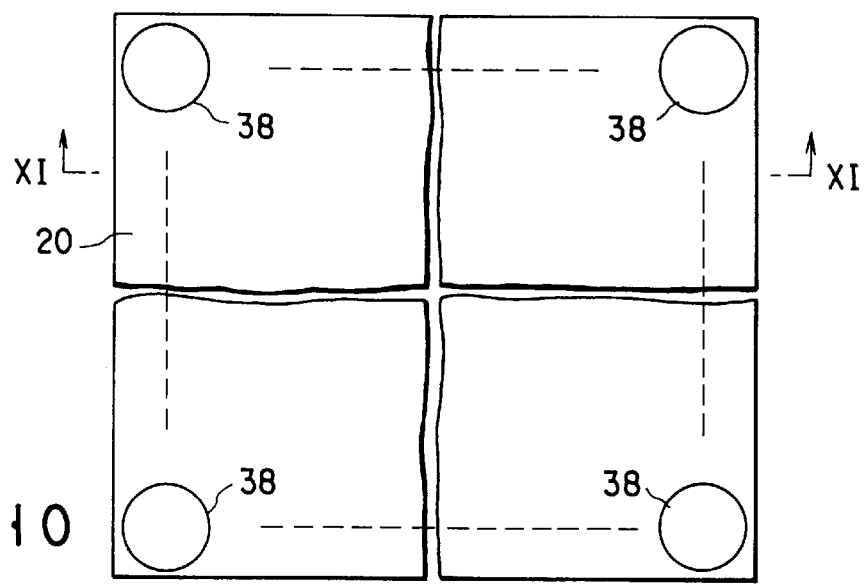
Figure 11:
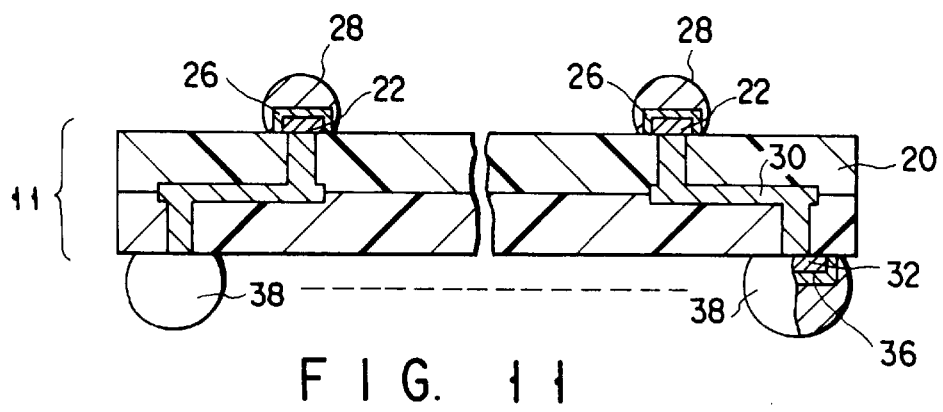
FIG. 11 is a cross sectional view taken along a line of XI—XI of each of FIGS. 9 and 10.

FIGS. 9 and 10 are views each showing a chip carrier, which is used in the semiconductor device of FIG. 6. FIG. 11 is a cross sectional view taken along a line of XI—XI of each of FIGS. 9 and 10.

In FIG. 9, an area, which is enclosed with two-dotted chain line 42, is an area where the LSI chip of each of FIGS. 7 and 8 is placed.

The carrier chip 11 comprises the laminate board 20 having a plurality of layers, wires 30 passing through each layer and each interlayer, electrodes 22 formed on one surface side of the laminate board 20, and electrodes 32 formed on the other surface side of the laminate board 20. The wires 30 electrically connect the electrodes 22 to the electrodes 32. The electrodes 22 are arrayed on one surface side of the laminate board 20. The electrodes 32 are arrayed on the other surface side of the laminate board 20.

The barrier metals 26 are formed on each of the electrodes 22. The barrier metals 26 can be formed of, for example, nickel (Ni). Similarly, the barrier metals 36 are formed on each of the electrodes 32. The barrier metals 36 can be formed of, for example, nickel (Ni).

Ball bumps 28 are formed on the barrier metals 26, respectively. The ball bumps 28 are formed of an alloy containing Sn (tin), and Pb (lead). The composition of the alloy is set to have, for example, Sn of 63 wt % and Pb of 37 wt % such that the melting point reaches the lowest point.

The ball electrodes 38 are formed on the barrier metals 36, respectively. The ball electrodes 38 are formed of the same material having the same composition as the ball bumps 28. For example, the ball bumps 38 are formed of an alloy containing Sn (tin), and Pb (lead). The composition of the alloy is set to have, for example, Sn of 63 wt % and Pb of 37 wt % such that the melting point reaches the lowest point.

The laminate board 20 of the chip carrier 11 can be formed of material such as glass epoxy resin, polyimide resin, phenolic resin, BT resin, bakelite, etc. The prices of these materials are reasonable and their melting points are low. It is not needed that the laminate board 20 be formed of expensive material such as alumina ceramics.

Next, the following will explain a first manufacturing method of the semiconductor device of the first invention as shown in FIG. 6.

Figure 12:
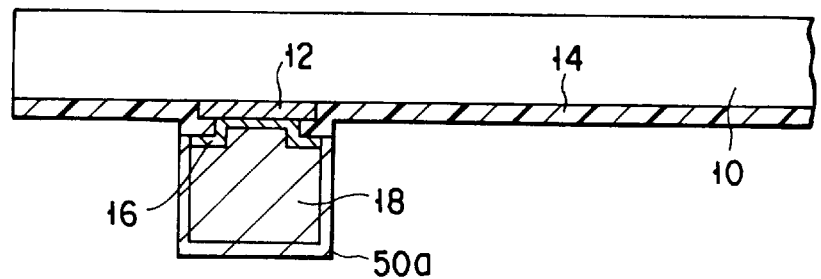
FIGS. 12 to 17 are views each showing a step of a first manufacturing method of the semiconductor device of FIG. 6.

As shown in FIG. 12, the bumps 18 are formed on the barrier metals 16 of the LSI chip 10 by an electrolytic plating method. The ball bumps 18 are formed of an alloy containing Sn (tin), and Pb (lead). The composition of the alloy is set to have, for example, Sn of 63 wt % and Pb of 37 wt % (eutectic solder) such that the melting point reaches the lowest point.

Thereafter, flux 50a is applied onto the surface of each bump 18. The application of flux 50a is carried out by use of cyclic amide solvent, isopropyl alcohol solvent, solvent of ethylene glycol monophenyl ether, etc.

As examples of flux, there are "R5002", "R5003" made by Nippon Arufametaruzu, "7200A" made by Senjukinzoku Kogyo, "Rappikusu R." As flux 50, it is best to use non-halogen series containing rosin as a main component.

The flux application step can be omitted.

Figure 13:
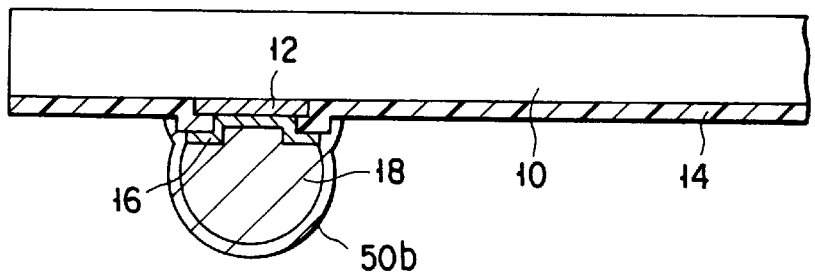

Next, as shown in FIG. 13, heat of 200° C. or more is added to the bumps 18 to be melted, and made to reflow (in the case of eutectic solder, the melting point is about 183° C.). At this time, the bumps 18 are spherically deformed by surface tension to improve wetability of the bumps 18.

Thereafter, flux 50b is applied onto the surface of each bump 18. The application of flux 50b is carried out by use of cyclic amide solvent, isopropyl alcohol solvent, solvent of ethylene glycol monophenyl ether, etc.

Figure 14:
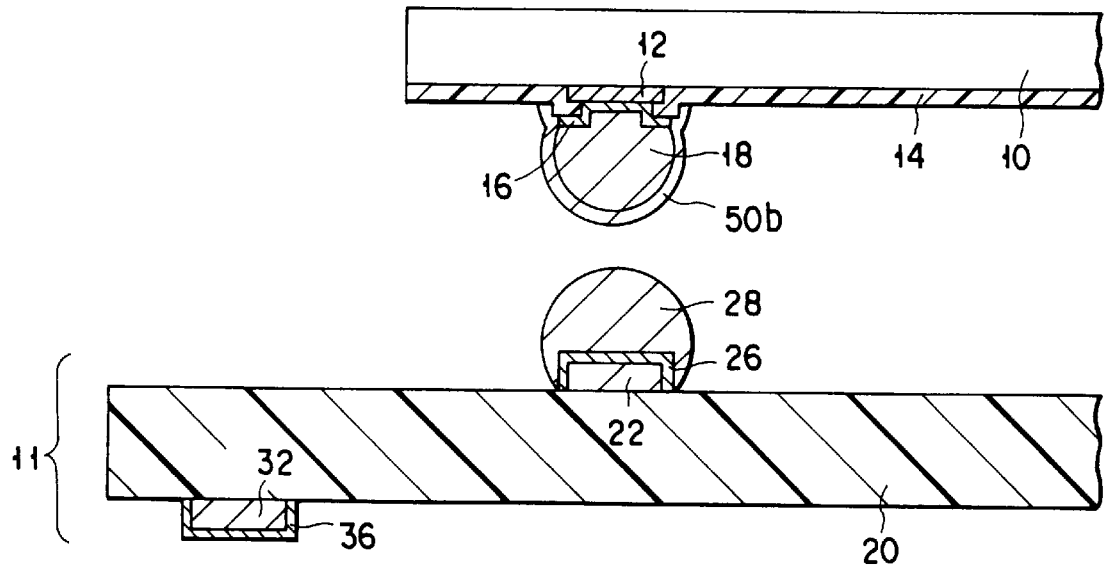

In parallel with the above step, as shown in FIG. 14, the bumps 28 are formed on the barrier metals 26 of one surface side of the chip carrier 11 by a non-electrolytic plating method. The bumps 28 are formed of an alloy containing Sn (tin), and Pb (lead). The composition of the alloy is set to have, for example, Sn of 63 wt % and Pb of 37 wt % (eutectic solder) such that the melting point reaches the lowest point.

After flux is applied onto the surface of the bumps 28, heat of 200° C. or more is added thereto to be melted, and made to reflow (in the case of eutectic solder, the melting point is about 183° C.). At this time, the bumps 28 are spherically deformed by surface tension to improve wetability of the bumps 28.

As shown in FIG. 14, the LSI chip 10 is placed on the chip carrier 11, and each bump 18 and each bump 28 are positioned to be opposite to each other.

Figure 15:
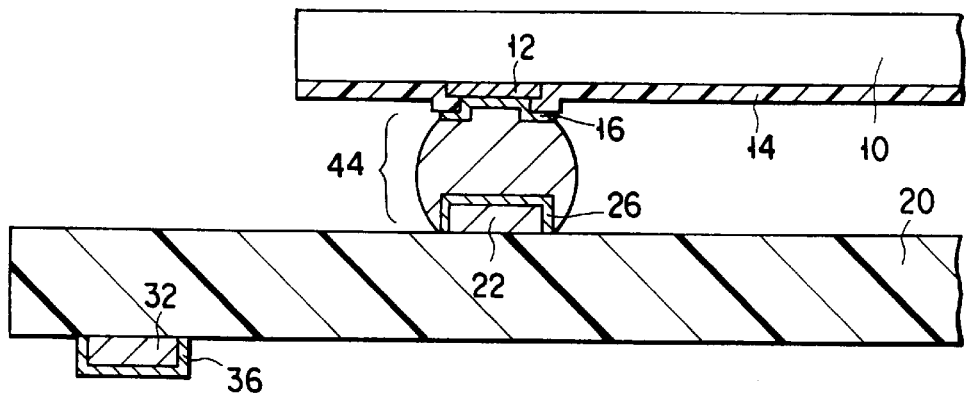

Then, as shown in FIG. 15, the bumps 18 and 28 are brought into contact with each other, and the LSI chip 10 and the chip carrier 11 are inserted into the reflow furnace. The temperature of the reflow furnace is set to be higher than the melting point of the bumps 18 and 28 (in the case of eutectic solder, the melting point is about 183° C.). For example, the temperature of the reflow furnace is set to about 220° C., and its upper limit is about 255° C. Also, existing time for the LSI chip 10 and the chip carrier 11 in the reflow furnace is set to 1 to 20 seconds (preferably about 2 seconds).

As a result, the bumps 18 and 28 are combined with each other, and a bump 44 is newly formed when the LSI chip 10 and the chip carrier 11 are transferred from the reflow furnace.

Thereafter, the LSI chip 10 and the chip carrier 11 are washed with cleaning agent such as isopropyl alcohol, EC-7 (trade name), Techno Care (trade name), etc., so as to remove flux added on the LSI chip 10 and the chip carrier 11.

Figure 16:
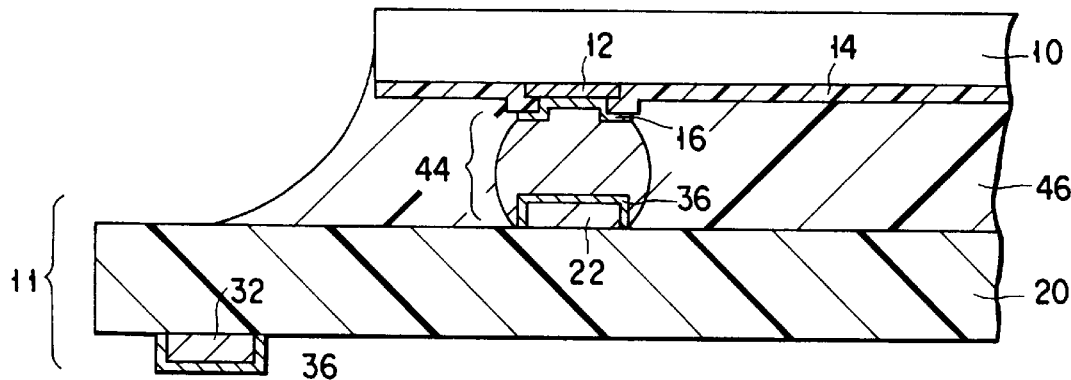

As shown in FIG. 16, resin 46 fills the space between the LSI chip 10 and the chip carrier 11. As resin 46, hot-setting resin such as polyimide can be used.

The formation of resin 46 can be carried out by the following method.

For example, a resin tablet is provided between the LSI chip 10 and the chip carrier 11. Thereafter, the LSI chip 10 and the chip carrier 11 are placed in an oven at 100(for one to four hours. As a result, the resin tablet is melted, and solidified, so that resin 46 is formed.

Figure 17:
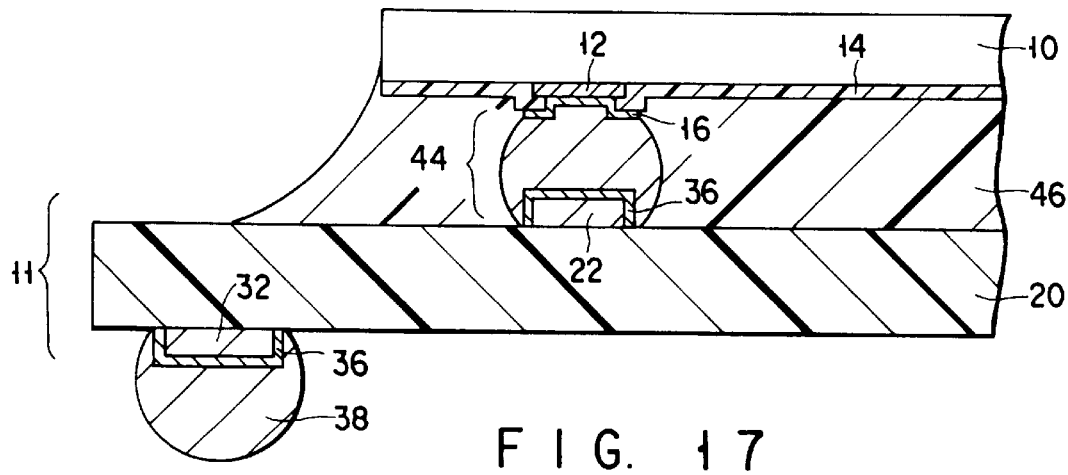

Then, as shown in FIG. 17, the ball electrode 38 is secured onto the barrier metal 36 of the other side of the chip carrier 11. The ball electrode 38 is formed of an alloy containing Sn (tin), and Pb (lead). The composition of the alloy is set to have, for example, Sn of 63 wt % and Pb of 37 wt % (eutectic solder) such that the melting point reaches the lowest point.

The feature of the above-mentioned manufacturing method lies in that the ball electrode 38 is formed on the barrier metal 36 of the chip carrier 11 after the combination of the LSI chip 10 and the chip carrier 11.

According to the above method, each electrode 38 is not unfavorably influenced by heat generated when the LSI chip 10 and the chip carrier 11 are combined with other. In other words, since the ball 38 is neither deformed nor distorted, the manufacturing yield of the semiconductor device can be improved.

FIG. 18 is a view showing a state when the semiconductor device of the first invention shown in FIG. 6 is mounted on the print circuit board.

Each ball electrode 38 of a semiconductor device 150 is placed on each electrode 8 of the print circuit board 200. Thereafter, the semiconductor device 150 and the print circuit board 200 are passed through the reflow furnace, so that the semiconductor 150 can be easily mounted on the print circuit board 200.

The following will explain a second manufacturing method of the semiconductor of the first invention shown in FIG. 6.

First, as shown in FIG. 19, the bumps 18 are formed on the barrier metals 16 of the LSI chip 10 by an electrolytic plating method. The ball bumps 18 are formed of an alloy containing Sn (tin), and Pb (lead). The composition of the alloy is set to have, for example, Sn of 63 wt % and Pb of 37 wt % (eutectic solder) such that the melting point reaches the lowest point.

Thereafter, flux 50a is applied onto the surface of each bump 18. The application of flux 50a is carried out by use of cyclic amide solvent, isopropyl alcohol solvent, solvent of ethylene glycol monophenyl ether, etc.

The flux application step can be omitted.

Next, as shown in FIG. 20, heat of 200° C. or more is added to the bumps 18 to be melted, and made to reflow (in the case of eutectic solder, the melting point is about 183° C.). At this time, the bumps 18 are spherically deformed by surface tension to improve wetability of the bumps 18.

Thereafter, flux 50b is applied onto the surface of each bump 18. The application of flux 50b is carried out by use of cyclic amide solvent, isopropyl alcohol solvent, solvent of ethylene glycol monophenyl ether, etc.

Figure 21:
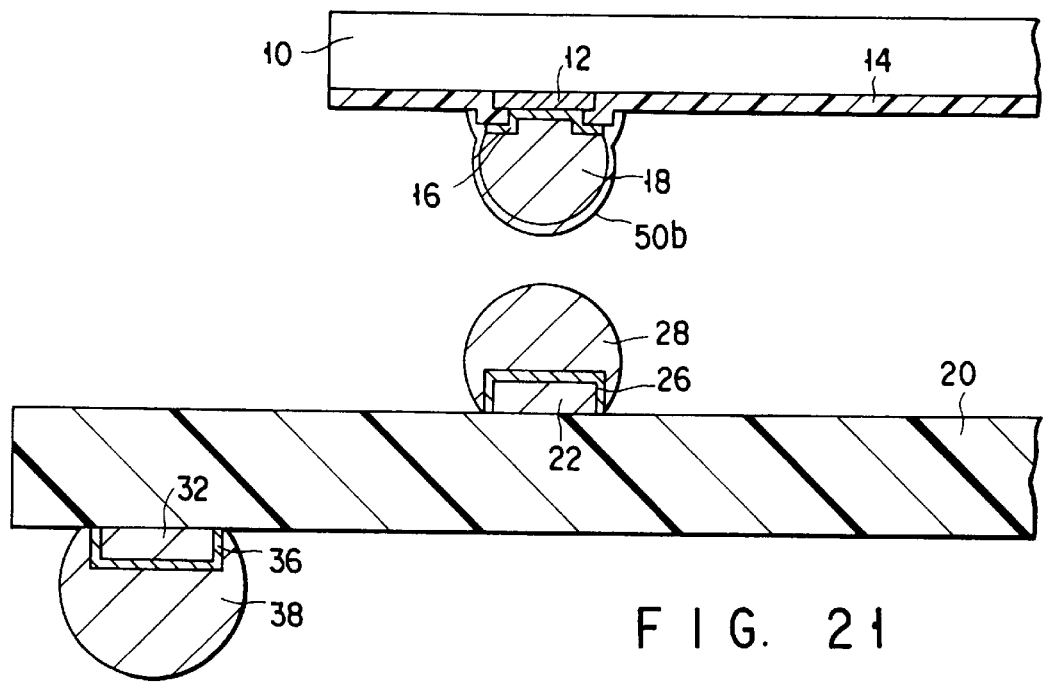

In parallel with the above step, as shown in FIG. 21, the bumps 28 are formed on the barrier metals 26 of one surface side of the chip carrier 11, and the electrodes 38 are formed on the barrier metals 36 of the other surface side by a non-electrolytic plating method. Both the bump 28 and the electrodes 38 are formed of an alloy containing Sn (tin), and Pb (lead). The composition of the alloy is set to have, for example, Sn of 63 wt % and Pb of 37 wt % (eutectic solder) such that the melting point reaches the lowest point.

After flux is applied onto the surface of the respective bumps 28 and electrodes 38. Then, heat of 200° C. or more is added thereto to be melted, and made to reflow (in the case of eutectic solder, the melting point is about 183° C.). At this time, the bumps 28 and the electrodes 38 are spherically deformed by surface tension to improve wetability of the bumps 28.

As shown in FIG. 21, the LSI chip 10 is placed on the chip carrier 11, and each bump 18 and each bump 28 are positioned to be opposite to each other.

Figure 22:
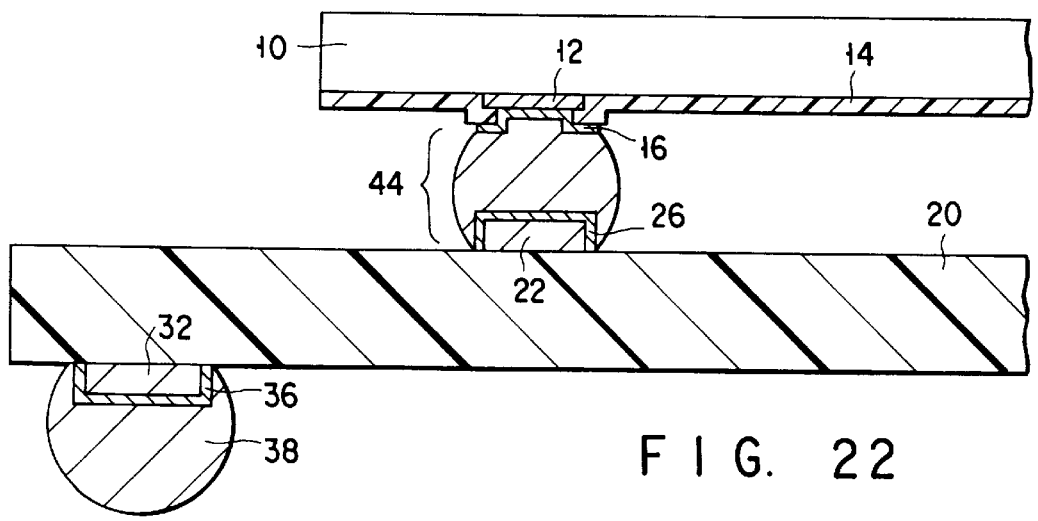

Then, as shown in FIG. 22, the bumps 18 and 28 are brought into contact with each other, and the LSI chip 10 and the chip carrier 11 are inserted into the reflow furnace. The temperature of the reflow furnace is set to be higher than the melting point of the bumps 18 and 28 (in the case of eutectic solder, the melting point is about 183° C. For example, the temperature of the reflow furnace is set to about 220° C., and its upper limit is about 255° C. Also, existing time for the LSI chip 10 and the chip carrier 11 in the reflow furnace is set to 1 to 20 seconds (preferably about 2 seconds).

As a result, the bumps 18 and 28 are combined with each other, and a bump 44 is newly formed when the LSI chip 10 and the chip carrier 11 are transferred from the reflow furnace.

In the reflow furnace, heat is also added to the ball electrodes 38. However, since no flux exists on the surface of each ball electrode 38, wetability of each ball electrode 38 is poor, so that the shape of each ball electrode 38 is not largely changed.

Thereafter, the LSI chip 10 and the chip carrier 11 are washed with cleaning agent such as isopropyl alcohol, EC-7 (trade name), Techno Care (trade name), etc., so as to remove flux added on the LSI chip 10 and the chip carrier 11.

Figure 23:
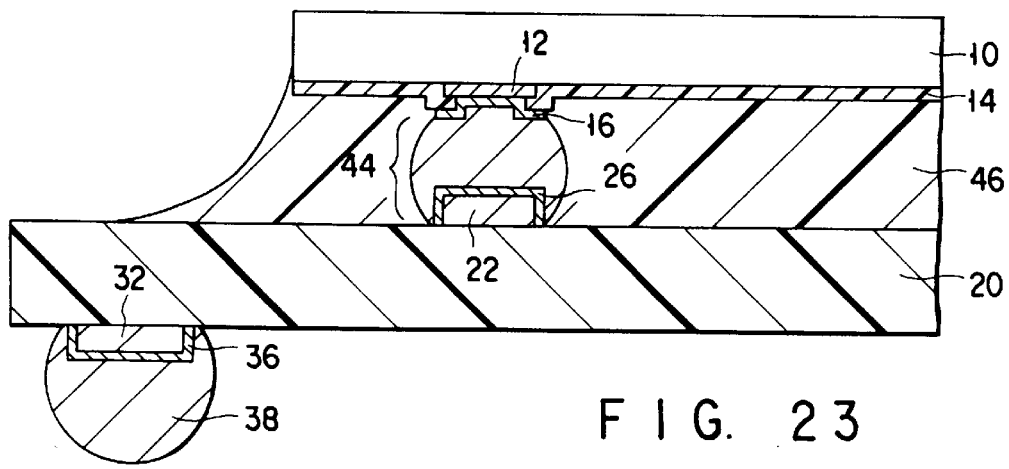

As shown in FIG. 23, resin 46 fills the space between the LSI chip 10 and the chip carrier 11. As resin 46, hot-setting resin such as polyimide can be used.

The formation of resin 46 can be carried out by the following method.

For example, a resin tablet is provided between the LSI chip 10 and the chip carrier 11. Thereafter, the LSI chip 10 and the chip carrier 11 are placed in an oven at 100° C. for one to four hours. As a result, the resin tablet is melted, and solidified, so that resin 46 is formed. Resin 46 may be formed by supplying resin having flowability to the space between the LSI chip 10 and the chip carrier 11 so as to be solidified.

The feature of the above manufacturing method lies in the following point.

Specifically, when the LIS chip 10 and the chip carrier 11 are combined with each other, the bumps 18 and 28 come in contact with flux 51b. However, each ball electrode 38 does not come in contact with flux.

In other words, the bumps 18 and 28 have a good wetability property, and are combined with each other so as be one bump 44 when the LSI chip 10 and the chip carrier 11 are combined with each other. However, since each ball electrode 38 does not come in contact with flux, its wetability property is poor and its shape are substantially unchanged.

Figure 24:
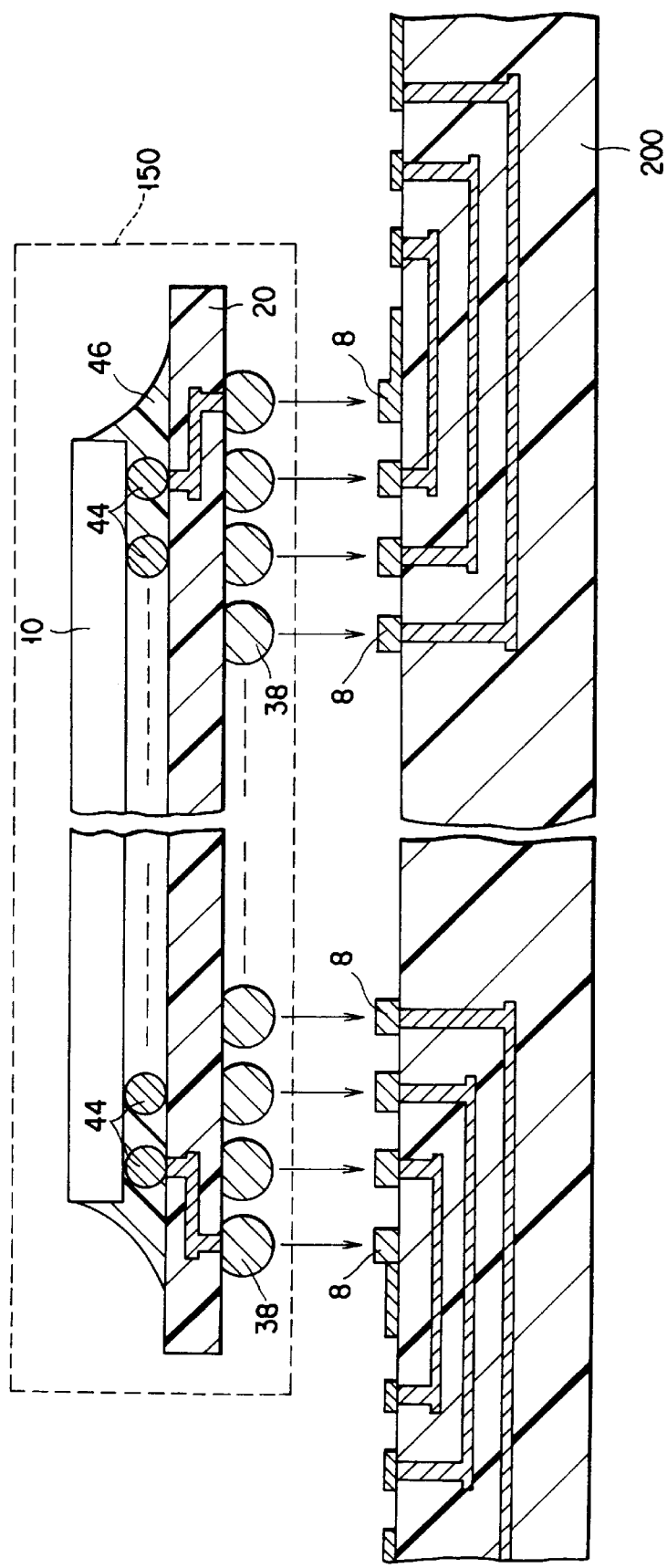
FIG. 24 is a view showing a state when the semiconductor device of FIG. 6 is mounted on the print circuit board.

FIG. 24 is a view showing a state when the semiconductor device of the first invention shown in FIG. 6 is mounted on the print circuit board.

Each ball electrode 38 of a semiconductor device 150 is placed on each electrode 8 of the print circuit board 200. Thereafter, the semiconductor device 150 and the print circuit board 200 are passed through the reflow furnace, so that the semiconductor 150 can be easily mounted on the print circuit board 200.

According to the semiconductor of the first invention of this application, the first feature is that the melting point of each bump 44 and that of each ball electrodes 38 are set to an appropriate temperature (for example, below 300° C.). The temperature does not have unfavorable influence on the elements of the LSI chip 10 and the laminate board 20 of the chip carrier 1.

For example, the bumps 44 and the ball electrodes 38 are formed of an alloy containing Sn (tin), and Pb (lead). The composition of the alloy is set to have, for example, Sn of 63 wt % and Pb of 37 wt % (eutectic solder) such that the melting point reaches the lowest point. In this case, the melting point of each of the bumps 44 and the ball electrodes 38 is about 183° C.

Therefore, when the LSI chip 10 and the chip carrier 11 are combined with each other, extremely high temperature (conventionally over 320° C.) is not added to the LSI chip 10 and the chip carrier 11. As a result, defective products are little manufactured, and manufacturing yield can be improved.

As mentioned above, unfavorable influence is not exerted on the elements of the LSI chip 10 and the laminate board 20 of the chip carrier 1. Due to this, the bumps 44 and the ball electrodes 38 can be formed of the same material having the same composition and the melting point of below 300° C.

If the bumps 44 and the ball electrodes 38 are formed of the same material having the same composition, the manufacturing process can be simplified, and the manufacturing cost can be reduced.

However, the point that the bumps 44 and the ball electrodes 38 are formed of the same material having the same composition is not the essential element.

For example, it is assumed that the bumps 44 and the ball electrodes 38 are not formed of the same material having the same composition and the melting point of each bump 44 and that of each ball electrode 38 are different from each other. In this case, both melting points may be set to temperature, which does not unfavorably influence on the elements of the LSI chip 10 and the laminate board 20 of the chip carrier 1 (for example, below 300° C.).

It is preferable that the melting point of each bump 44 and that of each ball electrode 38 be the same as each other or close to each other.

According to the semiconductor of the first invention of this application, the second feature is that resin 46 fills the space between the LSI chip 10 and the chip carrier 11, so that the bumps 44 are fixed by resin 46.

It is assumed that the melting point of each bump 44 and that of each ball electrode 38 be the same as each other or close to each other. In this case, there is possibility that heat will be added to the electrodes 38 and that the bumps 44 will be melted when the chip carrier 11 is mounted on the print circuit board 200.

If this state is left as it is, the bumps 44 is deformed, each pad 12 of the LSI chip 10 and each electrode 22 of the chip carrier 11 are disconnected from each other, or the adjacent bumps 11 are shortcircuited. As a result, the defective products may be manufactured.

To solve the above problem, resin 46 fills the space between the LSI chip 10 and the chip carrier 11, so that the bumps 44 are fixed by resin 46.

According to the semiconductor of the first invention of this application, the third feature can be explained as follows.

Specifically, the laminate board 20 of the chip carrier 11 can be formed of reasonable material (material having a low melting point) by providing the above first and second features.

For example, the laminate board 20 having the plurality of layers can be formed of material such as glass epoxy resin, polyimide resin, phenolic resin, BT resin, bakelite, etc.

Therefore, there is no need that the laminate board 20 be formed of expensive material such as alumina ceramics. As a result, the reduction of the manufacturing cost can be achieved.

The LSI chip 10 and the chip carrier 11, which are used in the semiconductor device of the first invention of this application, have the following features.

The bumps 18 are combined with the barrier metals 16 formed on the pads 12, respectively. The bumps 28 are combined with the barrier metals 26 formed on the electrodes 22 of one surface side of the chip carrier 11, respectively. The ball electrodes 38 are combined with the barrier metals 36 formed on the electrodes 22 of the other surface side of the chip carrier 11, respectively.

In this case, the bumps 18 of the LSI chip side and the bumps 28 of the chip carrier side are combined with each other, respectively, when the LSI chip 10 and the chip carrier 11 are combined with each other.

According to the first feature, if the bumps 18 and the bumps 28 are formed of the same material having the same composition, the bumps 18 and the bumps 28 can be easily combined with each other, respectively. In addition, the characteristics of the bumps 44, which are formed after the combination of the bumps 18 and 28, can be improved.

According to the second feature, if the bumps 18 and the bumps 28 are not formed of the same material having the same composition, this is inferior to the case that these bumps are formed of the same material having the same composition in the advantages. However, the advantages of the first invention can be all obtained from this case. The specific example of this case will be described later.

According to the third feature, the bumps 18 of the LSI chip side, the bumps 28 of the chip carrier side, and the ball electrodes 38 can be formed of the same material having the same composition. Particularly, in this case, the manufacturing process can be simplified. Also, this feature can contribute the reduction of the manufacturing cost.

According to the fourth feature, either the bumps 18 of the LSI chip side or the bumps 28 of the chip carrier side can be omitted. In other words, if the bumps are present on either LSI chip side or the chip carrier side, the LSI chip 10 and the chip carrier 11 can be combined with each other.

The following will explain the so-called C4 (Control Collapse Chip Connection) technique in which LSI chip 10 and chip carrier 11 are combined by the bumps formed of solder.

The C4 technique is disclosed in U.S. Pat. No. 4,825,2844 or Microelectronics Packaging Handbook, Van Nostrand Reinhold, New York, 1989, p368.

Figure 25:
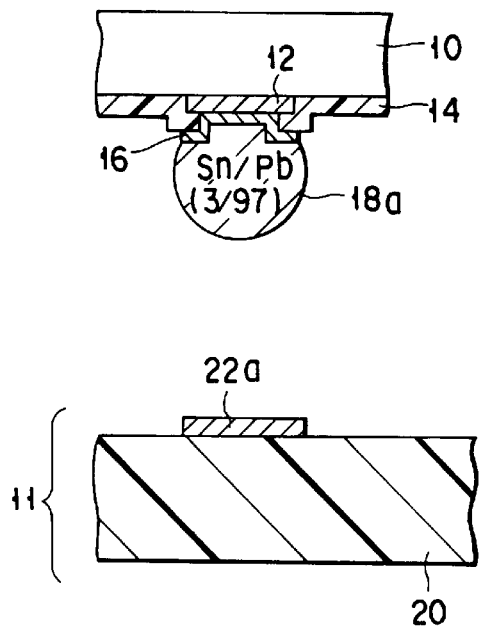
FIGS. 25 and 26 are views each showing a first example of the technique in which the LSI chip and the chip carrier are combined with each other.
Figure 26:
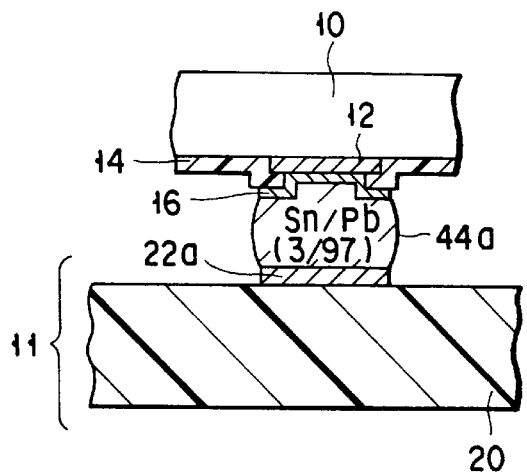

FIGS. 25 and 26 show the first example of the C4 technique.

This example will explain the conventional semiconductor device manufacturing method just for reference.

As shown in FIG. 25, a bump 18a is formed on the barrier metal 16 formed on the pad 12 of the LSI chip 10. The bump 18a is formed of solder (alloy) containing Sn (tin) and Pb (lead). The composition ratio of solder is Sn of 3 wt %:Pb of 97 wt %.

In this case, as is obvious from FIG. 33, the melting point of the bump 18a is about 320° C.

Thereafter, the bump 18a is placed on an electrode 22a of the laminate board 20 of the chip carrier 11. In this case, as laminate board 20, expansive ceramics, which can withstand against high temperature of 320° C. or more, is used. The electrode 22a is formed of, for example, Cu (copper).

Next, as shown in FIG. 26, the bump 18a is brought into contact with the electrode 22a of the chip carrier side. Then, under this state, the LSI chip 10 and the chip carrier 11 are passed through, for example, the reflow furnace.

As a result, the bump 18a is melted and changed to liquid. The electrode 22a is covered with the liquidized bump 18a. Then, the liquidized bump 18a is solidified to form the bump 44a. The bump 44a connects the pad 12 of the LSI 10 to the electrode 22a of the chip carrier 11.

In the above technique, the composition ratio of solder is Sn of 3 wt %:Pb of 97 wt %. In other words, this is not the eutectic solder.

FIG. 33 shows a phase diagram showing a solid area, which is below the line connecting points A, E, and D. In an α+β phase (below about 80° C.), solder is formed of crystal in which Sn and Pb are mixed with each other. In an a phase (about 80 to 310° C.), solder is formed of crystal in which Sn and Pb are mixed with each other and Pb crystal.

In other words, the bump 44a is formed of an alloy layer of Sn and Pb, and a Pb metal layer. The characteristics of two layers are different from each other, and a boundary surface is inevitably formed between these two layers.

As a result, the bump 44a is weak in stress due to heat. For example, the bump 44a is deformed by stress. Or, the bump 44 is separated from the pad 12 or the electrode 22a by stress.

Figure 27:
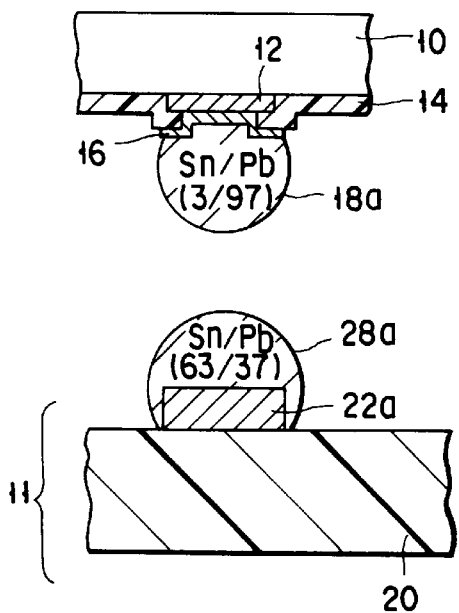
FIGS. 27 and 28 are views each showing a second example of the technique in which the LSI chip and the chip carrier are combined with each other.
Figure 28:
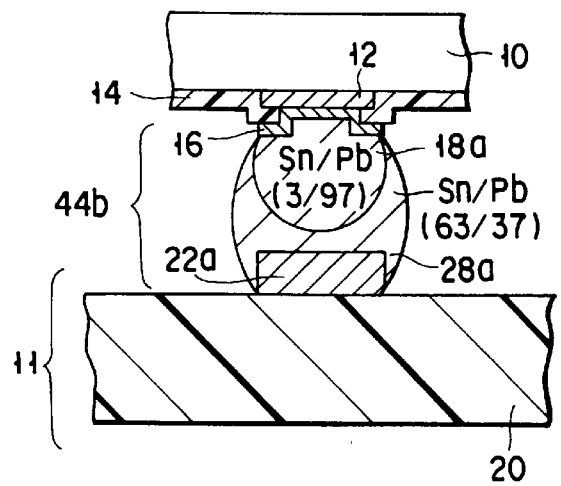

FIGS. 27 and 28 show the second example of the C4 technique.

As shown in FIG. 27, the bump 18a is formed on the barrier metal 16 formed on the pad 12 of the LSI chip 10. The bump 18a is formed of solder (alloy) containing Sn (tin) and Pb (lead). The composition ratio of solder is Sn of 3 wt %:Pb of 97 wt %.

In this case, as is obvious from FIG. 33, the melting point of the bump 18a is about 320° C.

Moreover, a bump 28a is formed on the electrode 22a of the chip carrier 11. The bump 28a is formed of solder (alloy) containing Sn (tin) and Pb (lead). The composition ratio of solder is Sn of 63 wt %:Pb of 37 wt %.

In this case, as is obvious from FIG. 33, this solder is eutectic, and the melting point of the bump 28a is about 183° C.

Thereafter, the bump 18a is placed on an electrode 28a of the laminate board 20 of the chip carrier 11. In this case, as laminate board 20, there is used a reasonable board, which can withstand against temperature of below a predetermined temperature, e.g., below 300° C.

For example, as the laminate board 20, there can be used material such as glass epoxy resin, polyimide resin, phenolic resin, BT resin, bakelite, etc. The electrode 22a can be formed of, e.g., Cu (copper).

Next, as shown in FIG. 28, the bump 18a is brought into contact with the bump 28a. Then, under this state, the LSI chip 10 and the chip carrier 11 are passed through, for example, the reflow furnace. The temperature of the reflow furnace is set to 183° C. or more and below 300° C. (for example, 220° C.).

As a result, the bump 18a remains solid. However, the bump 28a is melted and changed to liquid. The bump 18a is covered with the liquidized bump 28a. Then, the liquidized bump 28a is solidified to form the bump 44b. The bump 44b connects the pad 12 of the LSI 10 to the electrode 22a of the chip carrier 11.

In the above-explained technique, the eutectic bump 28a is melted at a low temperature of, for example, 220° C. As a result, the chip carrier 11 can be formed of reasonable laminate board 20, and this can contribute to the reduction of the manufacturing cost.

However, the bump 44b includes the first part 18a whose composition ratio is Sn of 3 wt %:Pb of 97 wt % and the second part 28a whose composition ratio is Sn of 63 wt %:Pb of 37 wt %.

In other words, the boundary is formed between the first part 18a and the second part 28a. The boundary expedites the deformation of the bump 44b or the distortion when stress due to heat is applied to the bump 44b. As a result, the pad 12 and the electrode 22a may be separated from each other. Or, the life of the semiconductor device may be shortened.

In the above-mentioned technique, the composition of the bump 18a and that of the bump 28a are replaced with each other. In this case, the bump 18a is changed to be eutectic. As a result, the bump 18a is melted, and the pad 12 and the electrode 22a are connected to each other.

The above-mentioned technique is disclosed in, for example, Proceedings of ECTC, 1993, IEEE, pp 182–186.

Figure 29:
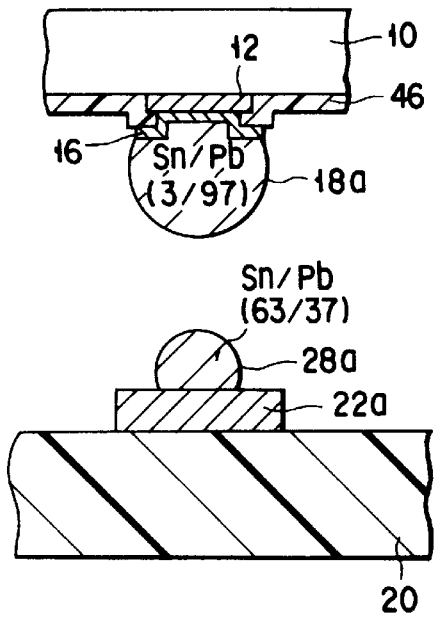
FIGS. 29 and 30 are views each showing a third example of the technique in which the LSI chip and the chip carrier are combined with each other.
Figure 30:
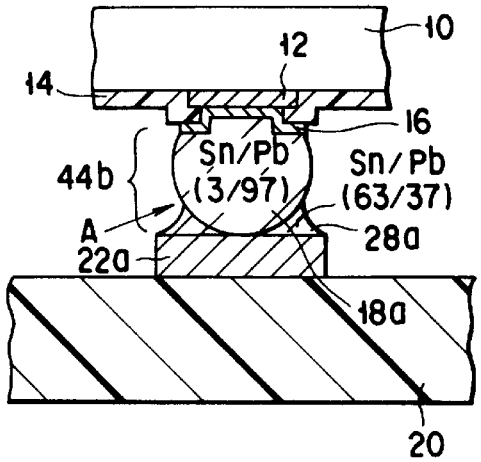

FIGS. 29 and 30 show the third example of the C4 technique.

As shown in FIG. 29, the bump 18a is formed on the barrier metal 16 formed on the pad 12 of the LSI chip 10. The bump 18a is formed of solder (alloy) containing Sn (tin) and Pb (lead). The composition ratio of solder is Sn of 3 wt %:Pb of 97 wt %.

In this case, as is obvious from FIG. 33, the melting point of the bump 18a is about 320° C.

Moreover, the bump 28a is formed on the electrode 22a of the chip carrier 11. The bump 28a is formed of solder (alloy) containing Sn (tin) and Pb (lead). The composition ratio of solder is Sn of 63 wt %:Pb of 37 wt %.

In this case, as is obvious from FIG. 33, this solder is changed to be eutectic, and the melting point of the bump 28a is about 183° C.

The bump 28a is formed to be smaller than the bump 18a because of an error of the process for forming the bumps. That is, this error may reduce the size of the bump 28a to be smaller than a design value.

Thereafter, the bump 18a is placed on the electrode 28a of the laminate board 20 of the chip carrier 11. In this case, as laminate board 20, there is used a reasonable board, which can withstand against temperature of below a predetermined temperature, e.g., below 300° C.

For example, as the laminate board 20, there can be used material such as glass epoxy resin, polyimide resin, phenolic resin, BT resin, bakelite, etc. The electrode 22a can be formed of, e.g., Cu (copper).

Next, as shown in FIG. 30, the bump 18a is brought into contact with the bump 28a. Then, under this state, the LSI chip 10 and the chip carrier 11 are passed through, for example, the reflow furnace. The temperature of the reflow furnace is set to 183° C. or more and below 300° C. (for example, 220° C.).

As a result, the bump 18a remains solid. However, the bump 28a is melted and changed to liquid. The lower surface of the bump 18a is covered with the liquidized bump 28a. Then, the liquidized bump 28a is solidified to form the bump 44b. The bump 44b connects the pad 12 of the LSI 10 to the electrode 22a of the chip carrier 11.

In the above-explained technique, the eutectic bump 28a is melted at a low temperature of, for example, 220° C., so that the pad 12 and the electrode 22a are connected to each other.

Therefore, the chip carrier 11 can be formed of reasonable laminate board 20, and this can contribute to the reduction of the manufacturing cost.

However, the bump 44b includes the first part 18a whose composition ratio is Sn of 3 wt %:Pb of 97 wt % and the second part 28a whose composition ratio is Sn of 63 wt % Pb of 37 wt %.

In other words, the boundary is formed between the first part 18a and the second part 28a. The boundary expedites the deformation of the bump 44b or the distortion when stress due to heat is applied to the bump 44b. As a result, the pad 12 and the electrode 22a may be separated from each other. Or, the life of the semiconductor device may be shortened.

The bump 28a is smaller than the bump 18a. The bump 18a is pushed into the bump 28a to make contact with a surface with a recess provided between the bumps 18a and 28a, that is, with less contact area A formed relation to a surface. Since stress easily concentrates on the contact area A, the bump 44b becomes weak in stress due to heat, so as to be easily deformed.

Figure 31:
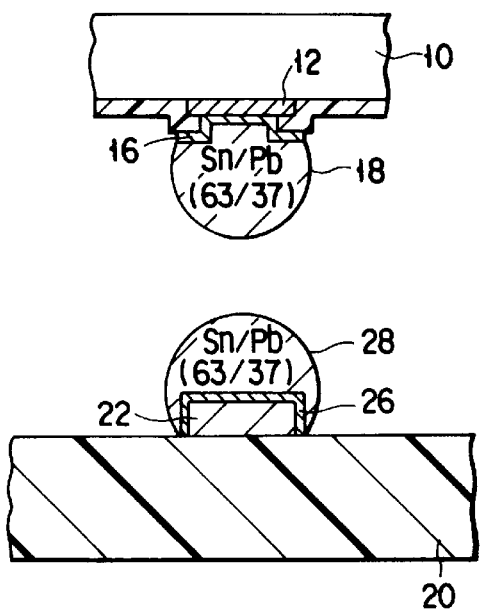
FIGS. 31 and 32 are views each showing a fourth example of the technique in which the LSI chip and the chip carrier are combined with each other.
Figure 32:
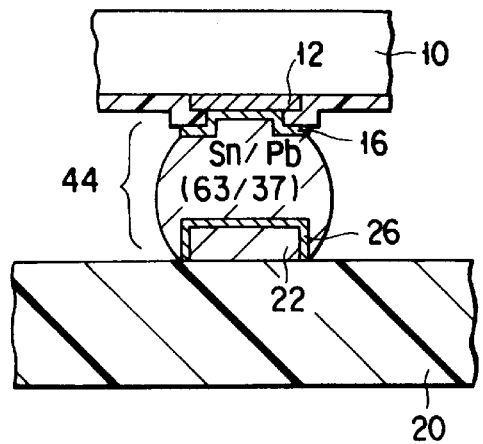

FIGS. 31 and 32 show the fourth example of the C4 technique.

This example shows the semiconductor device manufacturing method of the first and second inventions of this application.

As shown in FIG. 31, the bump 18 is formed on the barrier metal 16 formed on the pad 12 of the LSI chip 10. The bump 18 is formed of solder (alloy) containing Sn (tin) and Pb (lead). The composition ratio of solder is Sn of 63 wt %:Pb of 37 wt %.

In this case, as is obvious from FIG. 33, this solder is changed to be eutectic, and the melting point of the bump 18a is about 183° C.

Also, the bump 28 is formed on the barrier metal 26 formed on the electrode 22. The bump 28 is formed of solder (alloy) containing Sn (tin) and Pb (lead). The composition ratio of solder is Sn of 63 wt %:Pb of 37 wt %.

In this case, as is obvious from FIG. 33, this solder is changed to be eutectic, and the melting point of the bump 28 is about 183° C.

Thereafter, the bump 18 is placed on the electrode 28 of the laminate board 20 of the chip carrier 11. In this case, as laminate board 20, there is used a reasonable board, which can withstand against temperature of below a predetermined temperature, e.g., below 300° C.

For example, as the laminate board 20, there can be used material such as glass epoxy resin, polyimide resin, phenolic resin, BT resin, bakelite, etc. The electrode 22 can be formed of, e.g., Cu (copper).

Next, as shown in FIG. 32, the bump 18 is brought into contact with the bump 28a. Then, under this state, the LSI chip 10 and the chip carrier 11 are passed through, for example, the reflow furnace. The temperature of the reflow furnace is set to 183° C. or more and below 300° C. (for example, 220° C.).

As a result, the bumps 18 and 28 are melted and changed to liquid. Then, the liquidized bumps 18 and 28 are solidified to form the bump 44. The bump 44 connects the pad 12 of the LSI 10 to the electrode 22a of the chip carrier 11.

In the above-explained technique, the eutectic bumps 18 and 28 are melted at a low temperature of, for example, 220° C., so that the pad 12 and the electrode 22a are connected to each other.

As a result, the chip carrier 11 can be formed of reasonable laminate board 20, and this can contribute to the reduction of the manufacturing cost.

Moreover, since the bumps 18 and 28 are formed of the same material having the same material, no boundary exists in t he bump 44 where the LSI chip 10 and the chip carrier 11 are combined with each other.

As a result, even if stress is generated by heat, the bump 44 having no deformation and distortion can be formed, so that the manufacturing yield can be improved and the life of the product can be increased.

If the bumps 18 and 28 are eutectic, the bump 44 is always formed of the alloy having only Sn and Pb. As a result, since it is unnecessary to precipitate only Pb, strength of the bump 44 can be improved.

As shown in FIG. 33, if the composition of the bump 44 is set to have a range of Sn of 63±10 wt % and Pb of 37±10 wt %, the characteristic of the bump 44 is improved. The total percentage of Sn and Pb is of course 100 wt %.

Next, the following will explain the materials and the composition which can be used as the bumps 18, 28 and the electrode 38.

TABLE 1

|  | Alloy | Eutectic Composition |
|---|---|---|
| Two Elements | Sn—Pb | Sn: 63 wt %, Pb: 37 wt % |
|  | In—Sn | In: 52 wt %, Sn: 48 wt % |
|  | Bi—Sn | Bi: 58 wt %, Sn: 42 wt % |
|  | Sn—Zn | Sn: 91 wt %, Zn: 9 wt % |
|  | Sn—Au | Sn: 96.5 wt %, Ag: 3.5 wt % |
|  | Sn—Sb | Sn: 95 wt %, Sb: 5 wt % |
| Three Elements | Sn—Ag—Sb | Sn: 65 wt %, Ag: 25 wt %, Sb: 10 wt % |
|  | Sn—Cu—Ag | Sn: 95.5 wt %, Cu: 4.0 wt %, Ag: 0.5 wt % |
| Four Elements | Sn—Cu—Sb—Ag | Sn: 97 wt %, Cu: 2 wt %, Sb: 0.8 wt %, Ag: 0.2 wt % |

As shown in Table 1, regarding an alloy containing two elements, there can be used an alloy of Sn (tin) and Pb (lead), an alloy of In (indium) and Sn, an alloy of Bi (bismuth) and Sn, an alloy of Sn and Ag (silver), and an alloy of Sn and Sb (antimony).

Regarding an alloy containing three elements, there can be used an alloy of Sn, Ag, and Sb, and an alloy of Sn, Cu, and Ag.

Regarding an alloy containing four elements, there can be used an alloy of Sn, Cu, Sb, and Ag.

The alloys shown in Table 1 are eutectic. In their composition ratios, an error of ±10 wt % can be allowed.

The alloys shown in Table 1 are one example, and the other eutectic alloys and non-eutectic alloys can be used as bumps 18, 28 or ball electrode 38.

Next, the following will explain the material constituting resin 46.

Table 2 proposes four resin A to D as resin 46 to be used in the semiconductor device of FIG. 6.

The characteristic of each resin is determined based on Young's modulus and coefficient of thermal expansion as parameters.

TABLE 2

| Materials | Young's Modulus (MPa) | Coefficient of Thermal Expansion α (ppm/° C.) |
|---|---|---|
| Resin A | 3479 | 74 |
| Resin B | 5867 | 41 |
| Resin C | 6050 | 36 |
| Resin D | 9408 | 23 |

Resin A to D is constituted such that coefficient of thermal expansion a, glass transition point Tg, and Young's modulus E range in 20 to 78 ppm/° C., 100 to 200 ppm/° C., and 3000 to 9500 MPa at room temperature, respectively.

Resin A to D is hot-setting resin, which is formed of, for example, polyimide. Each resin can be formed by controlling the percentage of polybutadiene mixing with polyimide. Or, each resin can be formed by controlling a filler content of crushed quartz or spherical quartz adding to a mixture of polyimide and polybutadiene.

In the case of using quartz as a filler, the filler content of quartz in resin is set to 40 wt % or less (for example, 38 wt %). If the filler content of quartz exceeds 40 wt %, flowability of resin worsens and voids are often generated between the LSI chip 10 and the chip carrier 11.

U.S. Pat. No. 4,999,699 discloses the technique in which the filler (crushed quartz or spherical quartz) is added to resin. However, in this technique, the filler content of quartz in resin is set to 40 to 75 wt %.

Also, nitrogen aluminum (AlN, coefficient of thermal expansion α=2.9 ppm/° C.) can be used as a filler. In this case, the filler content of AlN in resin may be set to 75 wt % or more since coefficient of thermal expansion x of resin becomes 40 ppm/° C. However, if the filler content of AlN in resin exceeds 75 wt %, flowability of resin worsens and voids are often generated between the LSI chip 10 and the chip carrier 11.

In the case of using AlN as a filler, the diameter of particle of AlN is set to 0.5 μm or less. In this case, the probability of generating voids between the LSI chip 10 and the chip carrier 11 is greatly low.

As resin 46, there can be used polyimide resin, epoxy resin, butadiene resin, biphenyl resin, etc. Particularly, biphenyl resin has an advantage in that moisture absorbent of water is low.

FIG. 34 shows the relationship between temperature and distortion of the bump fixed to each of resin A to D of Table 2.

In the figure, the straight line of the upper left portion shows the relationship between the temperature and the distortion of the bump when no resin exists. In this case, the distortion of the bump is greatly high.

In the case that resin A to D is used, the distortion of the bump is greatly low as compared with the case that no resin exists.

In the case of resin A, resin A reaches glass transition point Tg at the time when temperature a little exceeds 100° C. At this time, the distortion of the bump is increased. In other words, at the temperature of glass transition point Tg, resin is changed to a rubber state, and elasticity of resin is greatly increased.

Similarly, in the cases of resin B and C, at the temperature of glass transition point Tg, resin is changed to a rubber state, and elasticity of resin is greatly increased. As a result, the distortion of the bump is increased.

In the case of resin D, the glass transition point Tg is higher than the melting point of the bump (eutectic case of Sn and Pb), that is, about 183° C. In other words, since resin is not changed to be a rubber state before the bump is liquidized, the distortion of the bump is restrained to the lowest minimum.

It is impossible to measure the distortion of the bump after the bump is liquidized, that is, temperature of about 183° C. or more. Due to this, the measuring result in the case of the temperature of about 183° C. or more is not described in FIG. 34.

If the distortion of the bump is reduced, there is reduced a probability in generating the connection failure between the LSI chip 10 and the chip carrier 11 due to heat generated when the semiconductor device is mounted on the print circuit board.

The following will explain the relationship between the glass transition point Tg of resin and that of the material constituting the laminate board 20 of the chip carrier 11.

To reduce the distortion of the bump, it is desired that the glass transition point Tg of resin and that of the material constituting the laminate board 20 be set to be higher than the melting point of the bump (eutectic case of Sn and Pb, about 183° C.). The reason can be explained as follows.

Specifically, if resin or the laminate board is changed to be in the rubber state before the bump is liquidized, the distortion of the bump is increased.

Moreover, the best way to reduce the distortion of the bump is that the glass transition point Tg is set to be higher than that of the material constituting the laminate board 20 (e.g., about 150° C.). The reason can be explained as follows.

Specifically, the strain of the bump given by the deformation of resin is larger than that of the bump given by the deformation of the laminate board.

Above results mean that low melting point bump and high Tg resin are improve the reliability.

Figure 35:
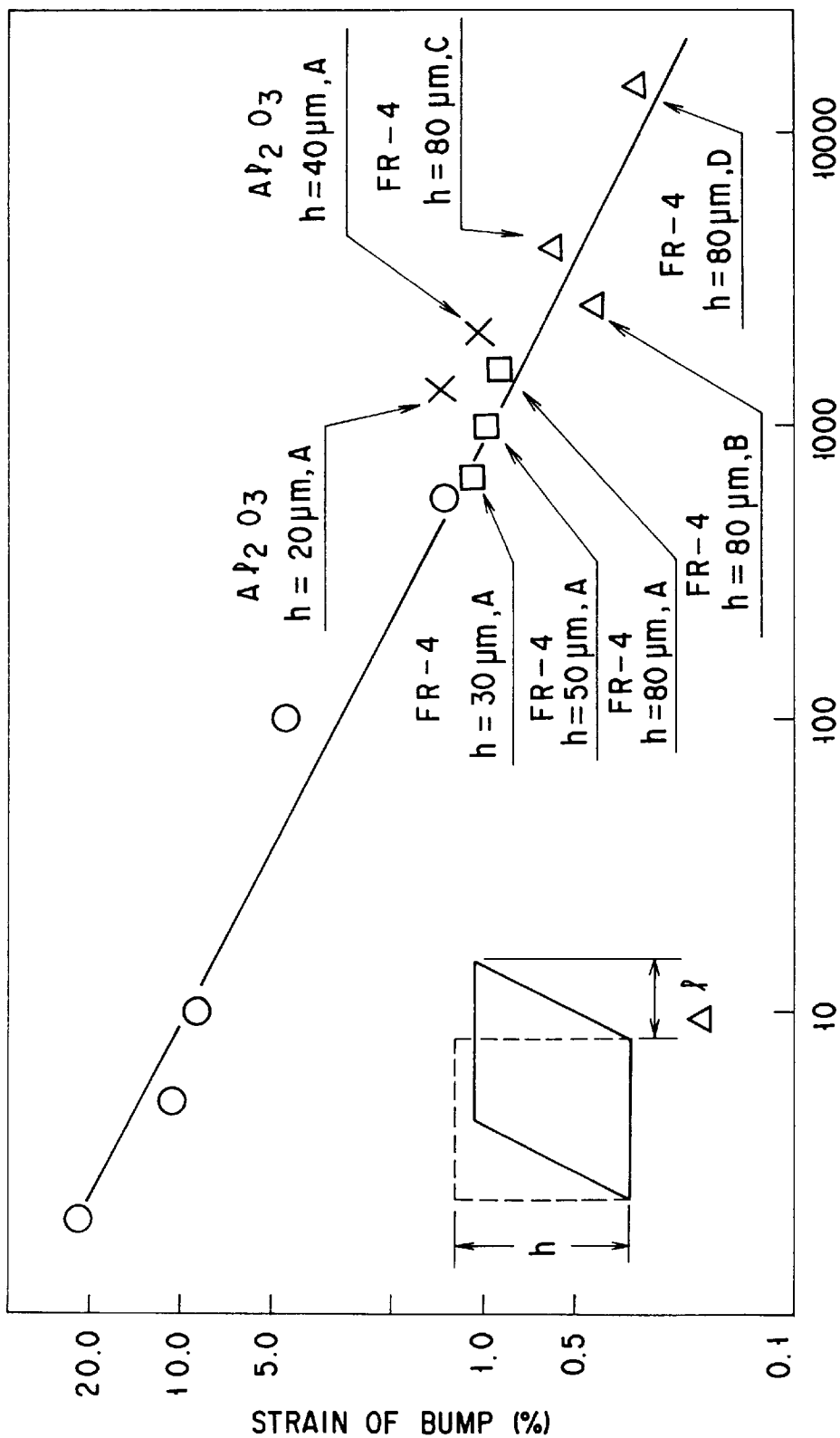
FIG. 35 is a view showing the relationship between a number of TCT cycles and distortion of the bump.

FIG. 35 shows the relationship between the strain and the fatigue life (TCT cycle) of bump.

In the figure, the experimental result of the semiconductor device having no resin is shown by a mark, "○". The experimental result of the semiconductor device having resin is shown by marks, "□", "Δ", and "X".

a. First experiment (mark "○")

The first experiment examined the relationship between the distortion of the bump and (Temperature Cycling Test) TCT cycle in connection with the semiconductor device having no resin. The result was that the distortion of the bump was increased in proportion to the increase in the TCT cycle. At this time, the temperature range was set to –65° C. to 100° C.

b. The second experiment (mark "□")

The second experiment examined the relationship between the distortion of the bump and TCT cycle in connection with the semiconductor device having resin. In this case, the kinds of resin was fixed, and the height (h) of the bump 44 was used as a parameter.

The height of the bump 44 was set to three kinds, 30 μm, 50 μm, and 80 μm. As resin 46, resin A of Table 2 (Young's Modulus E=3479 MPa, coefficient of thermal expansion α=74 ppm/° C.) was used. As laminate board 20, epoxy board (FR-4) was used.

The result was that the strain of the bump 44 was decreased in proportion to the increase in the height of the bump 44. In this case, the bump 44 cannot be limitlessly increased.

In consideration of the distance between the adjacent bumps, it is preferable that the height of the bump 44 (diameter in the case of spherical shape) be set to about 80 μm.

c. Third experiment (mark "Δ")

The third experiment examined the relationship between the distortion of the bump and TCT cycle in connection with the semiconductor device having resin. In this case, the height (h) of the bump 44 was fixed, and the kinds of resin was used as a parameter.

The height of the bump 44 was set to 80 μm. As resin 46, resin B of Table 2 (Young's Modulus E=5867 MPa, coefficient of thermal expansion α=41 ppm/° C.), and resin C of Table 2 (Young's Modulus E=6050 MPa, coefficient of thermal expansion α=36 ppm/° C.) were used. In this case, the experiment of resin A was omitted since the result was already obtained from the second experiment. As laminate board 20, glass epoxy board (FR-4) was used.

The result was that the distortion of the bump 44 was decreased in proportion to the increase in glass transition point Tg of resin. In other words, the fact shown in FIG. 34 was confirmed by this experiment.

d. Fourth experiment (mark "X")

The fourth experiment examined the relationship between the distortion of the bump and TCT cycle in connection with the semiconductor device having resin. In this case, the kinds of resin was fixed, and the height (h) of the bump 44 was used as a parameter. Unlike the second experiment, as laminate board 20, alumina ceramic board ($Al_2O_3$) was used.

The height of the bump was set to two kinds, 20 μm and 40 μm. As resin 46, resin A of Table 2 (Young's Modulus E=3479 MPa, coefficient of thermal expansion α=74 ppm/° C.) was used.

The result was that the distortion of the bump 44 was decreased in proportion to the increase in the height of the bump 44.

Moreover, even if aluminum nitride (AlN) is used in place of alumina ceramics as material for the laminate board 20, it can be considered that the same result is obtainable.

In consideration of the distance between the adjacent bumps, it is preferable that the height of the bump 44 (diameter in the case of spherical shape) be set to about 80 μm.

FIG. 36 is a view showing a semiconductor device having a ball grid array as a second invention of this invention. FIG. 37 is a cross sectional view taken along a line of XXXVII—XXXVII of FIG. 36.

The structure of the LSI chip 10 is the same as that of FIGS. 7 and 8.

The chip carrier has a laminate board 60 having a plurality of layers, wires 30 passing through each layer and each interlayer, electrodes 22 formed on one surface side of the laminate board 20, and electrodes 32 formed on the other surface side of the laminate board 20. The wires 30 electrically connect the electrodes 22 to the electrodes 32. The electrodes 22 are arrayed on one surface side of the laminate board 20. The electrodes 32 are arrayed on the other surface side of the laminate board 20.

The ball electrodes 38, which constitute the ball grid array, are formed on the barrier metals 36. The ball electrodes 38 are formed of metal such as solder, etc.

The ball bumps 44 are formed between the barrier metals 16 formed on the pads 12 of the LSI chip 10 and the barrier metals 26 formed on the electrodes 22 of the chip carrier 11. The ball bumps 44 are formed of metal such as solder, etc., and combine the pads 12 and the electrodes 22 with each other. As a result, the LSI chip 10 is brought in contact with the ball electrodes 38.

The ball electrodes 38 and the ball bumps 44 are formed of the same material having the same composition. For example, they are formed of an alloy containing Sn (tin), and Pb (lead). The composition of the alloy is set to have, for example, Sn of 63 wt % and Pb of 37 wt % such that the melting point reaches the lowest point.

As explained in the description of the related art, if the ball electrodes 38 and the ball bumps 44 are formed of the same material having the same composition, the following disadvantages occur.

Specifically, when the semiconductor device is mounted on the print circuit board, the bumps 44 are melted so as to be deformed and distorted.

To prevent the bumps 44 from being deformed and distorted, resin 46 is packed in the space between the LSI chip 10 and the chip carrier 11. The resin 46 fills the space between the plurality of the bumps 44 arranged in the array form, and the bumps 46 are fixed to each other. The resin 46 is formed of polyimide, and its glass transition point is higher than the melting point of at least each of the ball electrodes and the ball bumps 44.

Even if the bumps 44 are melted in mounting the semiconductor device on the print circuit board, the deformation and distortion of the bumps 44 can be restrained by resin 46.

The laminate board 20 of the chip carrier 11 can be formed of material such as glass epoxy resin, polyimide resin, phenolic resin, BT resin, bakelite, etc. The prices of these materials are reasonable and their melting points are low. It is not needed that the laminate board 20 be formed of expensive material such as alumina ceramics.

In other words, the ball electrodes 38 and the ball pumps 44 are formed of the same material and the same the same composition. Also, the melting point of each of the ball electrodes 38 and the ball bumps 44 are set to be low (for example, below 300° C.).

Therefore, according to the present invention, the miniaturize of the semiconductor device, the reduction of the manufacturing cost, and improvement of the manufacturing yield can be achieved at the same time.

The semiconductor device as the second invention of this application is different from the semiconductor device as first invention of this application on the following points.

In the first difference, the carrier 11 is structured such that the plurality of LSI chips are mounted thereon.

Specifically, the ship carrier 11 is shaped to be rectangular to mount the plurality of LSI chips thereon. Also, the chip carrier 11 has a plurality of slits 62 surrounding the LSI chips 10.

The semiconductor device of this invention includes a plurality of semiconductor devices of FIG. 6. In other words, if the laminate board 60 is cut along a one-dotted broken line 20' between the slits 62, the plurality of semiconductor devices of FIG. 6 can be produced from one semiconductor device of FIG. 36. The slits 62 determine the size of one semiconductor device of FIG. 6.

In the second difference, a plurality of sprocket holes 64 is formed along the edges of the long sides of the rectangular laminate board 60.

The sprocket holes 64 are formed to easily manufacture the semiconductor device of FIG. 36. For example, the transfer and positioning of the laminate board 60 are performed through the sprocket holes 64, thereby contributing to automation of the manufacturing process of the semiconductor device.

In the third difference, the laminate board 60 is not flexible, so that the laminate board 60 cannot be easily twisted.

To achieve the automation of the manufacturing process of the semiconductor device of this invention, it is required that the laminate board 60 have sufficient strength.

In the fourth difference, test terminals 70 are formed on the main surface of one side of the laminate board 60.

The test terminals 70 are provided to test the function of each LSI chip 10 without damaging the ball electrodes 38.

Japanese Patent Application KOKAI Publication No. 6-103704 disclosed an example in which test terminals are provided on the circuit board. However, unlike the present invention, the board on which the test terminals are provided is not hard.

In the semiconductor device of the second invention, the test terminals 70 are not covered with resin 46. Also, the test terminals 70 are provided at the inner side of the slit 62. Thereby, the test of the LSI chip 10 can be performed at any time before or after forming resin 46, or before or after cutting the laminate board 60.

According to the semiconductor device of the second invention, the manufacturing process of the semiconductor device can be automated so as to improve the throughput. Moreover, the function of each LSI chip 10 can be easily performed without damaging the ball electrodes 38.

FIG. 38 shows a state that one semiconductor device is extracted from the plurality of the semiconductor devices of FIG. 36. FIG. 39 shows a state that the LSI chips 10 are removed from the semiconductor device of FIG. 38.

The plurality of test terminals 70 are arranged along the edge of the semiconductor device on the main surface of one side of the laminate board 60. An index 66 is formed at one of four corners of the laminate board 60 to fix the direction of the semiconductor device. The index 66 can be appropriately formed when the laminate board 60 is cut.

In this example, through the index 66 is square-shaped, the corner may be circularly cut as shown in FIG. 40 or a hole may be formed at the corner portion as shown in FIG. 41.

It is desirable that the number of test terminals 70 be formed as small as possible. However, for extracting test signals from the LSI chip 10 in parallel, 200 or more test terminals 70 are needed. To solve such a problem, the semiconductor device may be structured such that the test signals are serially extracted from the LSI chips 10. Or, the number of test terminals 70 may be reduced by JTAG (Joint Test Action Group).

It is preferable that the number of test terminals be arranged along the edge of the semiconductor device in column.

According to the semiconductor device of the second invention, the laminate board 60 of the chip carrier 11 can be formed of materials having low price, high strength, and easily processing. For example, there can be used glass epoxy resin, polyimide resin, phenolic resin, BT resin, bakelite, etc.

The cutting of the laminate board 60 can be performed by either side of the manufacturer and the user.

Since an expensive metal mold is required to cut the laminate board 60, the laminate board cutting process is preferably performed by the manufacturer. In a case where the user cuts the laminate board 60, there are advantages in that the transport of the semiconductor devices can be easily carried out, and that the shape of the index 66 can be freely determined.

FIGS. 42 to 46 shows testers for testing the semiconductor device having the ball grid array, which is the third invention of this invention.

Figure 42:
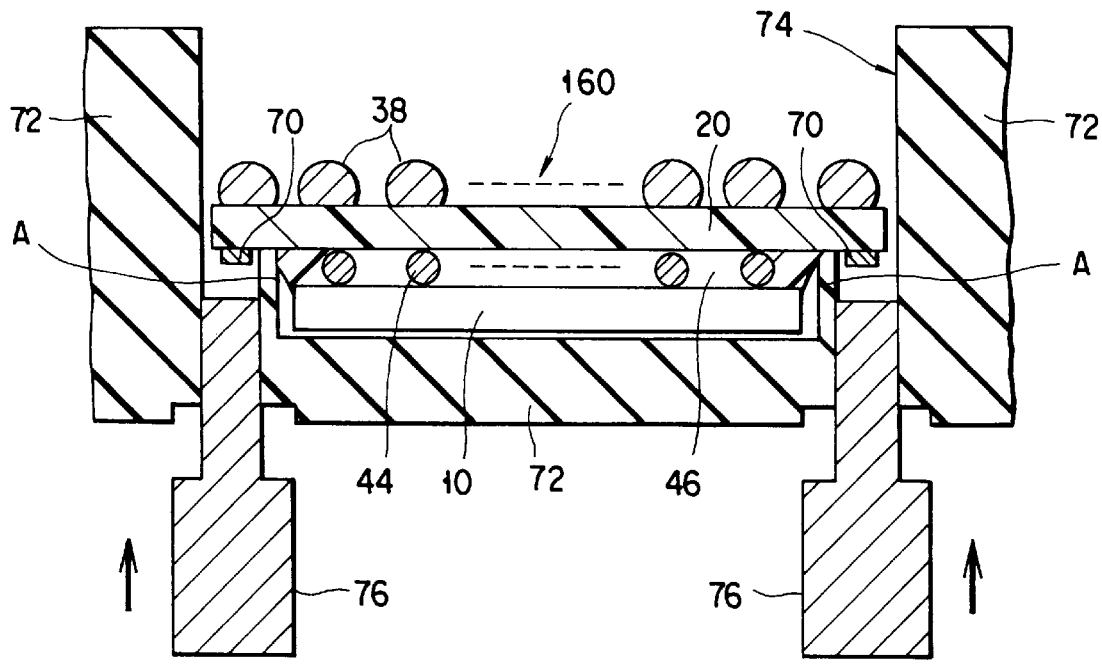
FIGS. 42 and 43 are views each showing a state of a test of the semiconductor device by use of a first tester.
Figure 43:
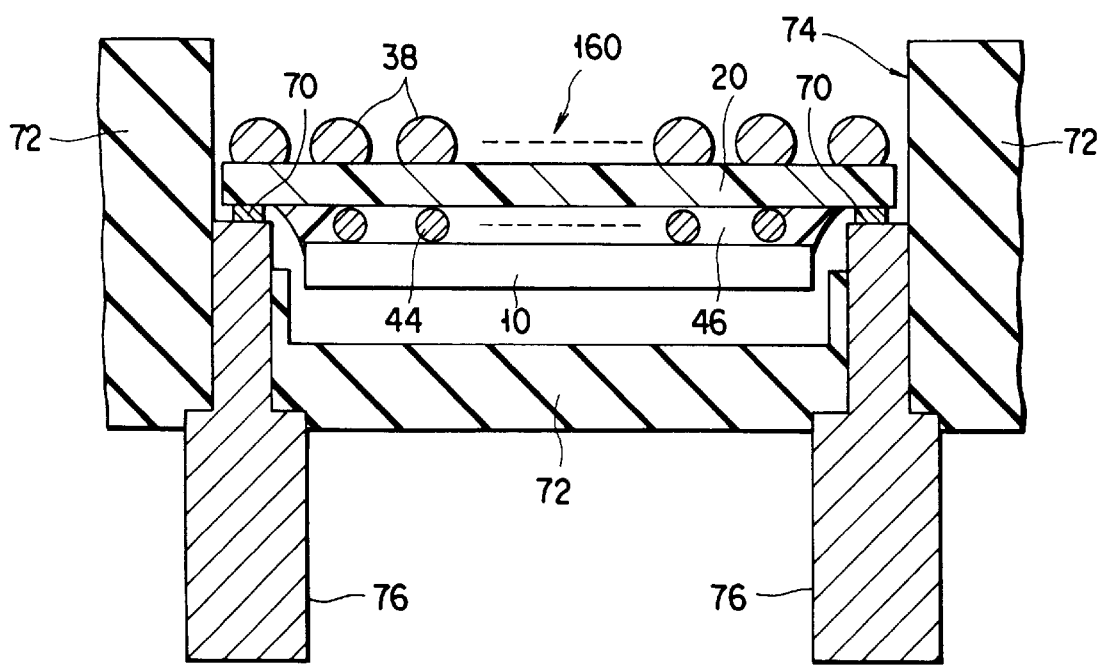

The following will explain the tester shown in FIGS. 42 and 43.

In each main body 72, a cavity 74 is formed to place a semiconductor device 160. Also, each main body 72 has a projection A for supporting the semiconductor device 160 between the cavities 74. The semiconductor device 160 is placed such that the ball electrodes 38 are arranged on the upper side and the LSI chip 10 and the test terminals 70 on the lower side.

Each main body 72 has a hole for guiding a socket electrode 76 into the cavity 74. The socket electrode 76 is movable up and down. The socket electrode 76 moves upward through the hole, and contacts the test terminal 70 of the semiconductor device 160.

The test signal is transmitted to the LSI chip 10 through the socket electrode 76 and the test terminal 70.

Figure 44:
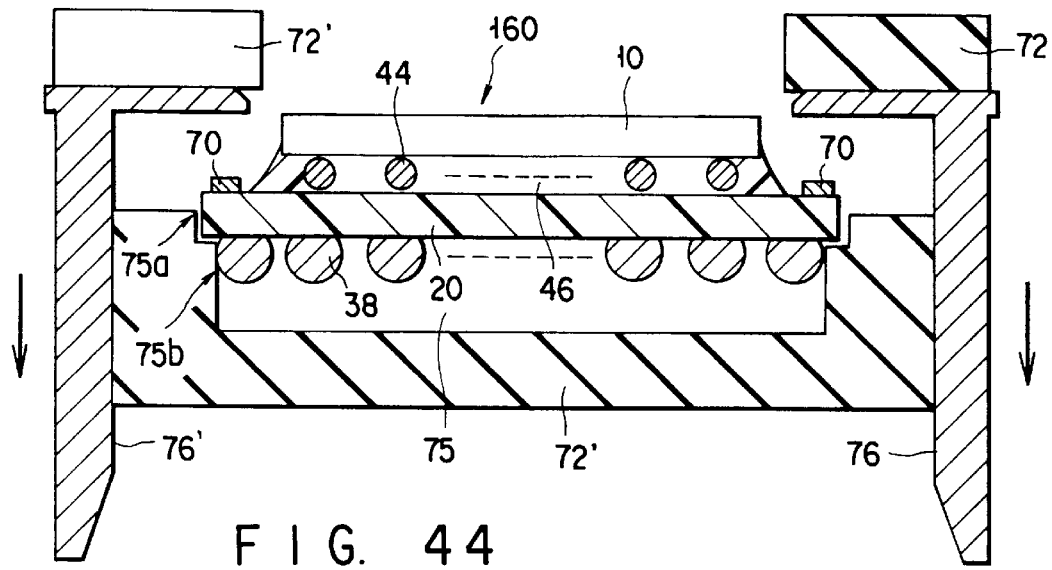
FIGS. 44 and 45 are views each showing a state of a test of the semiconductor device by use of a second tester.
Figure 45:
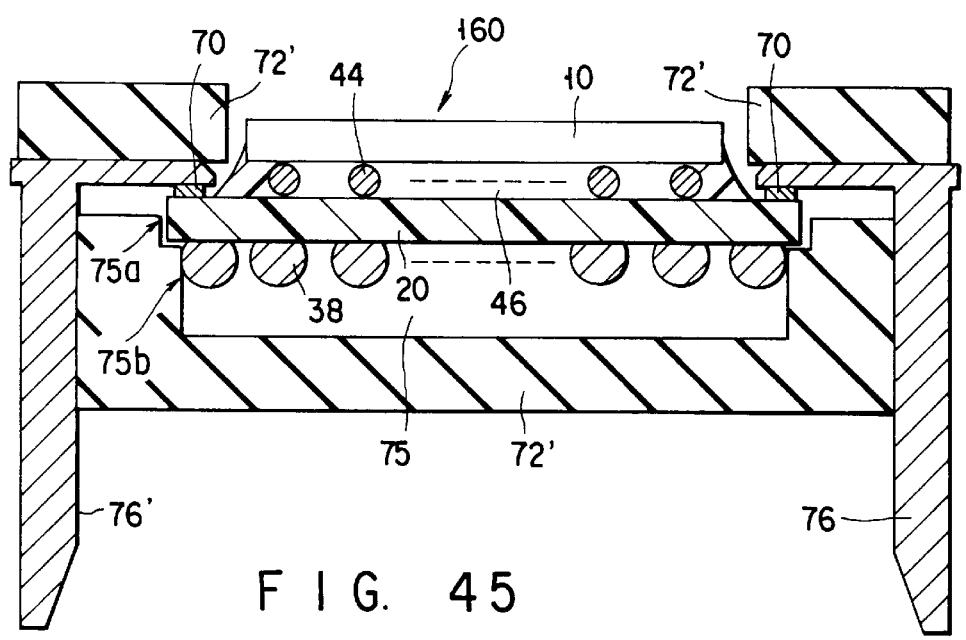

Next, the tester shown in FIGS. 44 and 45 will be explained as follows.

In each main body 72', a cavity 75 is formed to place the semiconductor device 160. The cavity 75 is formed of a portion 75a for supporting the edge of the semiconductor device 160, and a portion 75b for protecting the ball electrodes 38 of the semiconductor device 160. The semiconductor device 160 is placed such that the ball electrodes 38 are arranged on the lower side and the LSI chip 10 and the test terminals 70 on the upper side.

A socket electrode 76' is movable up and down. The socket electrode 76' moves upward, and contacts the test terminal 70 of the semiconductor device 160.

The test signal is transmitted to the LSI chip 10 through the socket electrode 76' and the test terminal 70.

Next, the tester shown in FIGS. 46 will be explained as follows.

Figure 46:
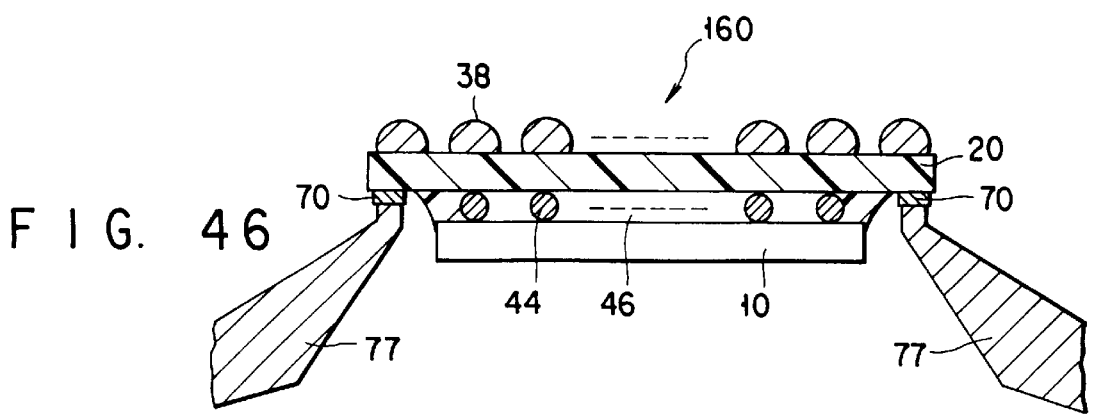
FIGS. 46 is a view showing a state of a test of the semiconductor device by use of a third tester.

The tester of FIG. 46 has probes 77. The probes 77 support the semiconductor device 160, and have a function of supplying the test signal to each test terminal 70, and executing the test.

The semiconductor device 160 is placed such that the ball electrodes 38 are arranged on the upper side and the LSI chip 10 and the test terminals 70 on the lower side.

In any of the above-explained three kinds of testers, the tester can test the LSI chip as projecting the ball electrodes 38. Moreover, since the test terminals are arranged along the edge of the semiconductor device 160, the electrical contact between the tester and the semiconductor can be easily made.

FIG. 47 shows a modification of the test terminals. FIG. 48 is a view in which the LSI chip 10 is removed from the semiconductor device of FIG. 47.

Regarding the shape of each test terminal, if the electrode of the tester can contact each test terminal, the shape is not limited.

For example, as shown in this example, a part of each wires formed at one surface side of the laminate board 20 may be directly used as the test terminal 70'.

FIG. 49 shows a modification of the semiconductor device having the test terminals.

The feature of the semiconductor device of this example lies in that the test terminals are covered with resin 46. In this case, the LSI chip 10 is, of course, tested before forming resin 46. Resin 46 is formed before cutting the laminate board 20.

Figure 50:
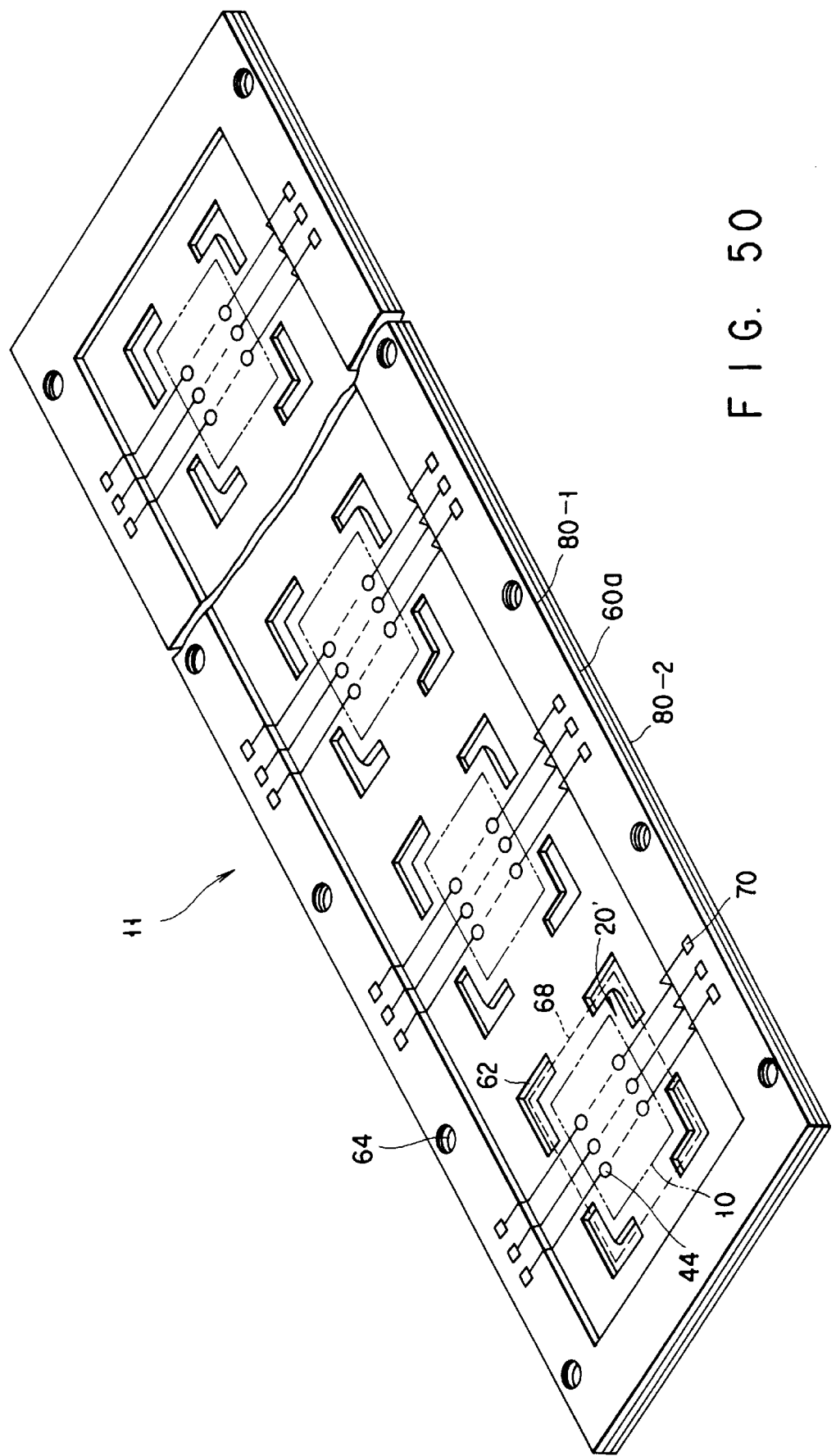
FIG. 50 is a view showing a first example of the chip carrier, which is used in the second invention of this application.

FIG. 50 shows the first example of the chip carrier 11, which is used in the semiconductor device of the second invention of this application.

As explained above, not the flexible laminate board but the hard laminate board can contribute to the automation of the manufacturing process. However, if the laminate board is too hard, there causes difficulty in cutting the laminate board.

The chip carrier explained below can not only contribute to the automation of the manufacturing process but be easily cut.

A laminate board 60a is formed of a flexible tape (board) or a thin board, which is not flexible, but can be easily cut.

For example, if the laminate board 60a is formed of epoxy resin, the thickness is limited to 0.6 mm to 0.9 mm.

For extracting the semiconductor device having one LSI chip from the semiconductor devices of FIG. 50, the laminate board 60a is cut along a broken line 68.

The chip carrier 11 of this example has reinforcing boards 80-1 and 80-2 for reinforcing the edge of the laminate board 60a to prevent the chip carrier 11 from being twisted, bent, or warped.

The reinforcing boards 80-1 and 80-2 have the same shape as each other, and form a frame of the chip carrier 11. The reinforcing boards 80-1 and 80-2 are provided at one surface side and the other surface side of the laminate board 60a, respectively, to sandwich the laminate board 60a therebetween.

The reinforcing boards 80-1 and 80-2 are formed of hard material which is not flexible. In the hard material, twisting, bending and warping are not generated. For example, if the reinforcing boards 80-1 and 80-2 are formed of epoxy resin, the thickness is limited to 1 mm or more, for example, about 1.2 mm.

The test terminals 70 are formed on the reinforcing board 80-1, that is, the most difficult area to deform.

The sprocket holes 64 are formed to be passed through the laminate board 60a and the reinforcing boards 80-1 and 80-2.

In the above-explained chip carrier 11, the laminate board 60a itself is flexible, and the cutting can be easily performed. Moreover, the edge of the laminate board 60a is reinforced by the reinforcing boards 80-1 and 80-2, the sprocket holes 64 and the test terminals 70 are formed on the reinforcing boards 80-1 and 80-2. As a result, the test of the semiconductor device and the transfer can be easily performed, and this can contribute to the automation of the manufacturing process.

Figure 51:
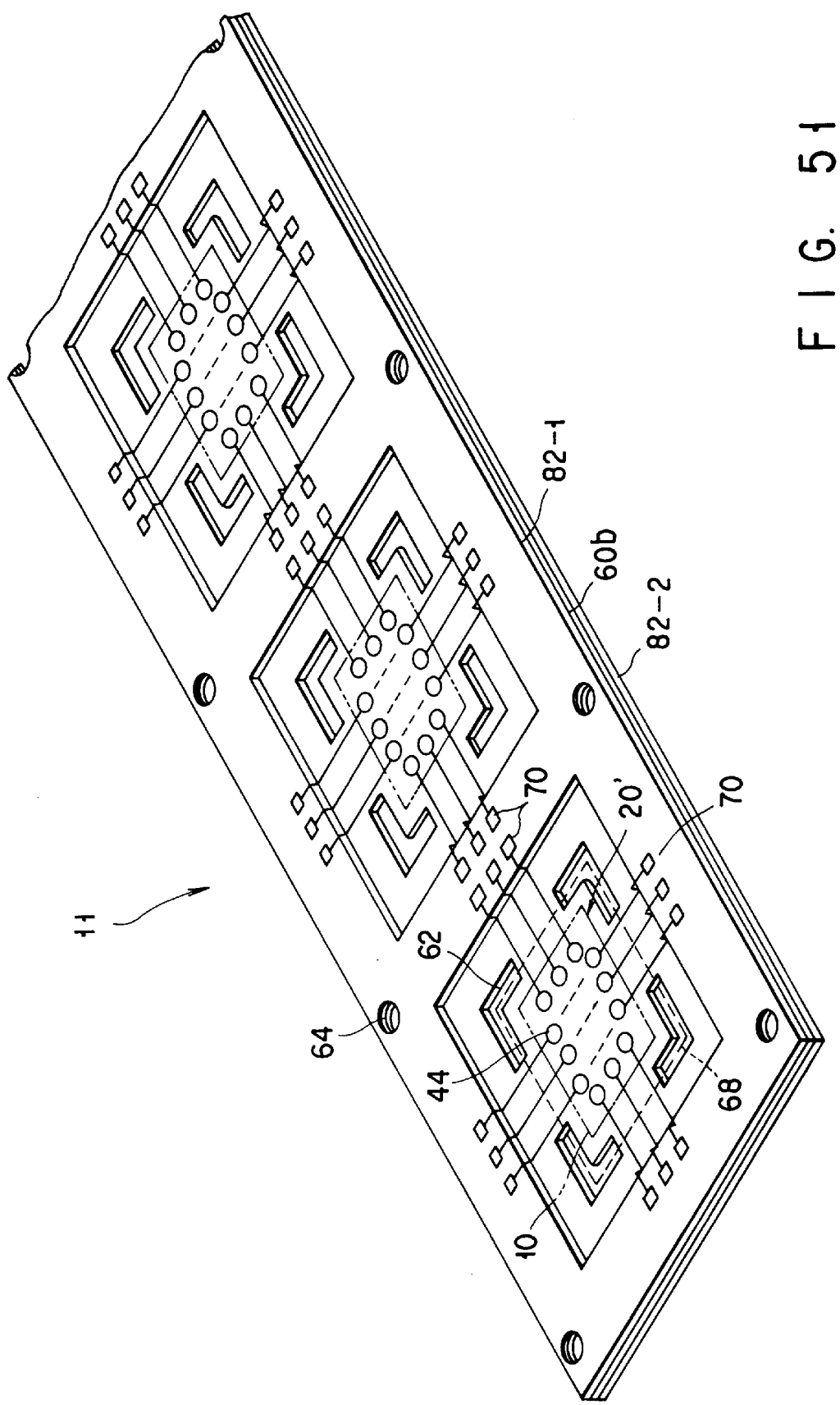
FIG. 51 is a view showing a second example of the chip carrier, which is used in the second invention of this application.

FIG. 51 shows the second example of the chip carrier 11, which is used in the semiconductor device of the second invention of this application.

A laminate board 60b is formed of a flexible tape (board) or a thin board, which is not flexible, but can be easily cut.

For example, if the laminate board 60b is formed of epoxy resin, the thickness is limited to 0.6 mm to 0.9 mm.

For extracting the semiconductor device having one LSI chip from the semiconductor devices of FIG. 50, the laminate board 60b is cut along the broken line 68.

The chip carrier 11 of this example has reinforcing boards 80-1 and 80-2 for reinforcing the edge of the laminate board 60b to prevent the chip carrier 11 from being twisted, bent, or warped.

The reinforcing boards 80-1 and 80-2 have the same ladder shape as each other. The reinforcing boards 80-1 and 80-2 are provided at one surface side and the other surface side of the laminate board 60b, respectively, to sandwich the laminate board 60b therebetween.

The reinforcing boards 80-1 and 80-2 are formed of hard material which is not flexible. In the hard material, twisting, bending and warping are not generated. For example, if the reinforcing boards 80-1 and 80-2 are formed of epoxy resin, the thickness is limited to 1 mm or more, for example, about 1.2 mm.

The test terminals 70 are formed on the reinforcing board 80-1, that is, the most difficult area to deform.

The sprocket holes 64 are formed to be passed through the laminate board 60b and the reinforcing boards 80-1 and 80-2.

In the above-explained chip carrier 11, the laminate board 60b itself is flexible, and the cutting can be easily performed. Moreover, the edge of the laminate board 60b is reinforced by the reinforcing boards 80-1 and 80-2, the sprocket holes 64 and the test terminals 70 are formed on the reinforcing boards 80-1 and 80-2. As a result, the test of the semiconductor device and the transfer can be easily performed, and this can contribute to the automation of the manufacturing process.

Figure 52:
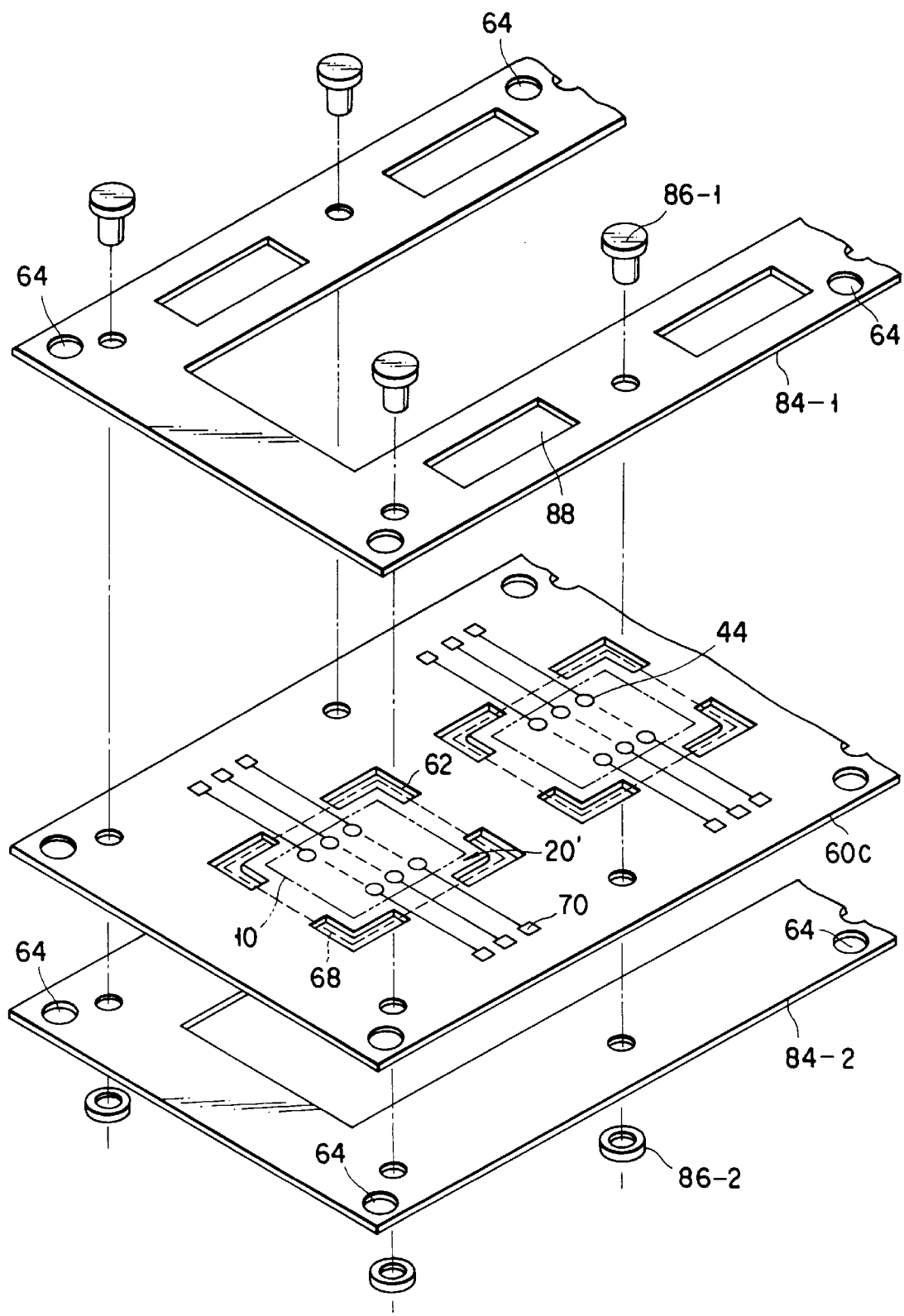
FIG. 52 is a view showing a third example of the chip carrier, which is used in the second invention of this application.

FIG. 52 shows the second example of the chip carrier 11, which is used in the semiconductor device of the second invention of this application.

A laminate board 60c is formed of a flexible tape (board) or a thin board, which is not flexible, but can be easily cut.

For example, if the laminate board 60c is formed of epoxy resin, the thickness is limited to 0.6 mm to 0.9 mm.

For extracting the semiconductor device having one LSI chip from the semiconductor devices of FIG. 50, the laminate board 60c is cut along the broken line 68.

The plurality of test terminals 70 are formed on one surface side of the laminate board 60c along the edge of the laminate board 60c.

Moreover, the chip carrier 11 has reinforcing boards 84-1 and 84-2 for reinforcing the laminate board 60c. Thereby, the chip carrier 11 can be prevented from being twisted, bent, warped.

The reinforcing boards 84-1 and 84-2 are frame-shaped to have substantially the same outer shapes. In this case, the reinforcing board 84-1 is different from the reinforcing board 84-2 in that openings 88 for exposing the test terminals 70. The reinforcing boards 84-1 and 84-2 are provided at one surface side and the other surface side of the laminate board 60c, respectively, to sandwich the laminate board 60c therebetween.

The reinforcing boards 84-1 and 84-2 are secured to the laminate board 60c with fixtures 86-1 and 86-2. The fixtures 86-1 and 86-2 are formed of, for example, a vis and a washer, a bolt and a nut.

The reinforcing boards 84-1 and 84-2 are formed of hard material, which is not flexible. In the hard material, twisting, bending and warping are not generated. For example, if the reinforcing boards 84-1 and 84-2 are formed of epoxy resin, the thickness is limited to about 1.2 mm.

The test terminals 70 are formed to be overlapped with the openings 88 of the reinforcing board 84-1. The sprocket holes 64 are formed to be passed through the laminate board 60c and the reinforcing boards 84-1 and 84-2.

In the above-explained chip carrier 11, the laminate board 60c itself is flexible, and the cutting can be easily performed. Moreover, the laminate board 60b is reinforced by the reinforcing boards 80-1 and 80-2, the sprocket holes 64 and the test terminals 70 are formed on the reinforcing boards 80-1 and 80-2. As a result, the test of the semiconductor device and the transfer can be easily performed, and this can contribute to the automation of the manufacturing process.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   an LSI chip having first electrodes arranged on a main surface of said LSI chip;
   a chip carrier mounted to said LSI chip, said chip carrier having a board formed of a material having a glass transition point, second electrodes arranged on a first surface of said board, third electrodes arranged on a second surface of said board, and a wiring pattern for connecting said second electrodes to said third electrodes;
   bumps for connecting said first electrodes of said LSI chip to said second electrodes of said chip carrier, said main surface of said LSI chip being opposite to said first surface of said board; and
   resin filling a space between said main surface of said LSI chip and said first surface of said board, so as to fix said bumps wherein a glass transition point of said resin is greater than said glass transition point of said board.

2. The device according to claim 1, wherein said first electrodes of said LSI chips are formed of pads connected to semiconductor elements of said LSI chip, and barrier metals covering a surface of each of said pads.

3. The device according to claim 1, wherein the surfaces of said second and third electrodes of said chip carrier are covered with barrier metals, respectively.

4. The device according to claim 1, wherein said bumps are ball-shaped, and arrayed between the main surface of said LSI chip and the first surface of said board.

5. The device according to claim 1, wherein each of said bumps is formed of an alloy having a plurality of elements.

6. The device according to claim 5, wherein a composition of said alloy is set such that said alloy becomes eutectic.

7. The device according to claim 1, wherein each of said bumps is formed of the alloy containing Sn (tin) and Pb (lead), and a composition of said alloy is set to have Sn of 63 wt % and Pb of 37 wt %.

8. The device according to claim 1, wherein said board is a laminate board having a plurality of layers, and said wiring pattern is arranged to pass through each layer.

9. The device according to claim 1, further comprising ball electrodes combined with said third electrodes, respectively, and said ball electrodes arrayed on the second surface of said board.

10. The device according to claim 9, wherein each of said ball electrodes is formed of an alloy having a plurality of elements.

11. The device according to claim 10, wherein a composition of said alloy is set such that said alloy becomes eutectic.

12. The device according to claim 9, wherein each of said ball electrodes is formed of the alloy containing Sn (tin) and Pb (lead), and a composition of said alloy is set to have Sn of 63 wt % and Pb of 37 wt %.

13. The device according to claim 9, wherein said bumps and said ball electrodes are formed by the same material having the same composition.

14. The device according to claim 1, a melting point of said board is set to be higher than a melting point of each of said bumps.

15. The device according to claim 1, wherein said board is formed of one material selected from a group having glass epoxy resin, polyimide resin, phenolic resin, BT resin, bakelite.

16. The device according to claim 1, wherein said resin is formed of material whose glass transition point is higher than the melting point of each of said bumps.

17. The device according to claim 1, wherein said resin is formed of polyimide and polybutadiene, and contains a filler formed of quartz.

18. The device according to claim 17, wherein a content of said filler is 40% or less of the total weight of the resin and filler.

19. The device according to claim 1, wherein said resin is formed of polyimide and polybutadiene, and contains a filler formed of nitrogen aluminum.

20. The device according to claim 19, wherein a content of said filler is 75% or more of the total weight of the resin and filler, and its diameter of particle is 0.5 $\mu$m or less.

21. The device according to claim 1, further comprising test terminals, formed on an edge portion of said board, for testing a function of said LSI chip.

22. The device according to claim 21, wherein said test terminals are arranged on an outer section of said resin.

23. The device according to claim 21, wherein said test terminals are arranged on an inner section of said resin.

24. The device according to claim 1, further comprising an index, formed at each of corners of said board, for expressing a direction of said semiconductor device.

25. A semiconductor device comprising:
   an LSI chip having first electrodes arranged on a main surface of said LSI chip;
   a chip carrier mounted to said LSI chip, said chip carrier having a board formed of a material having a glass transition point and having slits surrounding carrier sections, second electrodes arranged on a first surface of said board, third electrodes arranged on a second surface of said board, third electrodes arranged on a second surface of said board, and a wiring pattern for connecting said second electrodes to said third electrodes;
   bumps for connecting said first electrodes of said LSI chip to the second electrodes of said chip carrier, said LSI chip arranged on said carrier sections, said main surface of said LSI chip being opposite to said first surface of said board; and
   resin filling a space between the main surface of said LSI chip and said first surface of said board, so as to fix said bumps, wherein a glass transition point of said resin is greater than said glass transition point of said board.

26. The device according to claim 25, further comprising sprocket holes, arranged on an edge of said board, for transferring said board.

27. The device according to claim 25, further comprising test terminals, formed along said slits at the inner side of the first surface side of said board, for testing a function of said LSI chip.

28. The device according to claim 27, wherein said test terminals are arranged on an outer section of said resin.

29. The device according to claim 27, wherein said test terminals are arranged on an inner section of said resin.

30. The device according to claim 25, wherein said first electrodes of said LSI chips have pads connected to semiconductor elements of said LSI chips and barrier metals covering the surfaces of said pads, respectively.

31. The device according to claim 25, wherein the surfaces of said second and third electrodes are covered with barrier metals, respectively.

32. The device according to claim 25, wherein said bumps are ball-shaped, and arrayed between the main surface of said LSI chip and the first surface of said board.

33. The device according to claim 25, wherein each of said bumps is formed of an alloy having a plurality of elements.

34. The device according to claim 25, wherein a composition of said alloy is set such that said alloy becomes eutectic.

35. The device according to claim 25, wherein each of said bumps is formed of the alloy containing Sn (tin) and Pb (lead), and a composition of said alloy is set to have Sn of 63 wt % and Pb of 37 wt %.

36. The device according to claim 25, wherein said board is a laminate board having a plurality of layers, and said wiring pattern is arranged to pass through each layer.

37. The device according to claim 25, further comprising ball electrodes combined with said third electrodes, respectively, and said ball electrodes arrayed on the second surface of said board.

38. The device according to claim 37, wherein each of said ball electrodes is formed of an alloy having a plurality of elements.

39. The device according to claim 38, wherein a composition of said alloy is set such that said alloy becomes eutectic.

40. The device according to claim 37, wherein each of said ball electrodes is formed of the alloy containing Sn (tin) and Pb (lead), and a composition of said alloy is set to have Sn of 63 wt % and Pb of 37 wt %.

41. The device according to claim 37, wherein said bumps and said ball electrodes are formed by the same material having the same composition.

42. The device according to claim 37, a melting point of said board is set to be higher than a melting point of each of said bumps.

43. The device according to claim 25, wherein said board is formed of one material selected from a group having glass epoxy resin, polyimide resin, phenolic resin, BT resin, bakelite.

44. The device according to claim 25, wherein said resin is formed of material whose glass transition point is higher than the melting point of each of said bumps.

45. The device according to claim 25, wherein said resin is formed of polyimide and polybutadiene, and contains a filler formed of quartz.

46. The device according to claim 45, wherein a content of said filler is 40% or less of the total weight of the resin and filler.

47. The device according to claim 25, wherein said resin is formed of polyimide and polybutadiene, and contains a filler formed of nitrogen aluminum.

48. The device according to claim 47, wherein a content of said filler is 75% or more of the total weight of the resin and filler, and its diameter of particle is 0.5 $\mu$m or less.

49. A semiconductor device comprising:
   an LSI chip having semiconductor elements; an insulating film covering a main surface of said LSI chip, and having holes;
   electrodes arranged to be exposed to a bottom portion of said holes of said insulating film;
   bumps combined with said electrodes, and arrayed on the main surface of said LSI, each of said bumps formed of an alloy having a plurality of elements, and a composition of said alloy set such that said alloy becomes eutectic;
   a chip carrier mounted to said LSI chip, said chip carrier having a board formed of a material having a glass transition point; and
   resin filling a space between said main surface of said LSI chip and said board, wherein a glass transition point of said resin is greater than said glass transition point of said board.

* * * * *

UNITED STATES PATENT AND TRADEMARK OFFICE
CERTIFICATE OF CORRECTION

PATENT NO. : 5,998,861
DATED : December 7, 1999
INVENTOR(S) : Yoichi HIRUTA

It is certified that error appears in the above-identified patent and that said Letters Patent is hereby corrected as shown below:

On the Title Page, Item [57], in the Abstract, lines 4-5, "second electrodes to third electrode each other" should read --second electrodes and third electrodes to each other--; and in line 6, after "carrier", insert --to--.

*In Claim 1, col. 26, line 18, after "bumps", insert --,--.

Signed and Sealed this

Tenth Day of April, 2001

*Attest:*

NICHOLAS P. GODICI

*Attesting Officer*  *Acting Director of the United States Patent and Trademark Office*